(12) United States Patent
Lin et al.

(10) Patent No.: US 12,094,782 B2
(45) Date of Patent: Sep. 17, 2024

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Shih-Yao Lin, New Taipei (TW); Chieh-Ning Feng, Taichung (TW); Hsiao Wen Lee, Hsinchu (TW); Ming-Ching Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 236 days.

(21) Appl. No.: 17/461,618

(22) Filed: Aug. 30, 2021

(65) Prior Publication Data

US 2023/0061497 A1 Mar. 2, 2023

(51) Int. Cl.
*H01L 21/8234* (2006.01)
*H01L 27/088* (2006.01)

(52) U.S. Cl.
CPC .......... *H01L 21/823481* (2013.01); *H01L 21/823456* (2013.01); *H01L 27/088* (2013.01)

(58) Field of Classification Search
CPC ............ H01L 21/76229; H01L 21/76224
See application file for complete search history.

(56) References Cited

U.S. PATENT DOCUMENTS

| | | | |
|---|---|---|---|
| 2019/0267374 A1* | 8/2019 | Hung | H01L 21/823437 |
| 2019/0378903 A1* | 12/2019 | Jeon | H01L 21/823431 |
| 2020/0091311 A1* | 3/2020 | Hsu | H01L 21/31055 |
| 2020/0343372 A1* | 10/2020 | Yu | H01L 29/775 |

* cited by examiner

*Primary Examiner* — John A Bodnar
(74) *Attorney, Agent, or Firm* — FOLEY & LARDNER LLP

(57) ABSTRACT

A method includes forming a dielectric fin over a substrate between a first semiconductor fin and a second semiconductor fin. The first and second semiconductor fins, and the dielectric fin all extend along a first lateral direction. The method includes forming a dummy gate structure that extends along a second lateral direction and includes a first portion and a second portion. The first and second portions overlay the first and second semiconductor fins, respectively, and separate from each other with the dielectric fin. The method includes removing upper sidewall portions of the dielectric fin. The method includes replacing the first and second portions of the dummy gate structure with a first and second active gate structures, respectively.

19 Claims, 33 Drawing Sheets

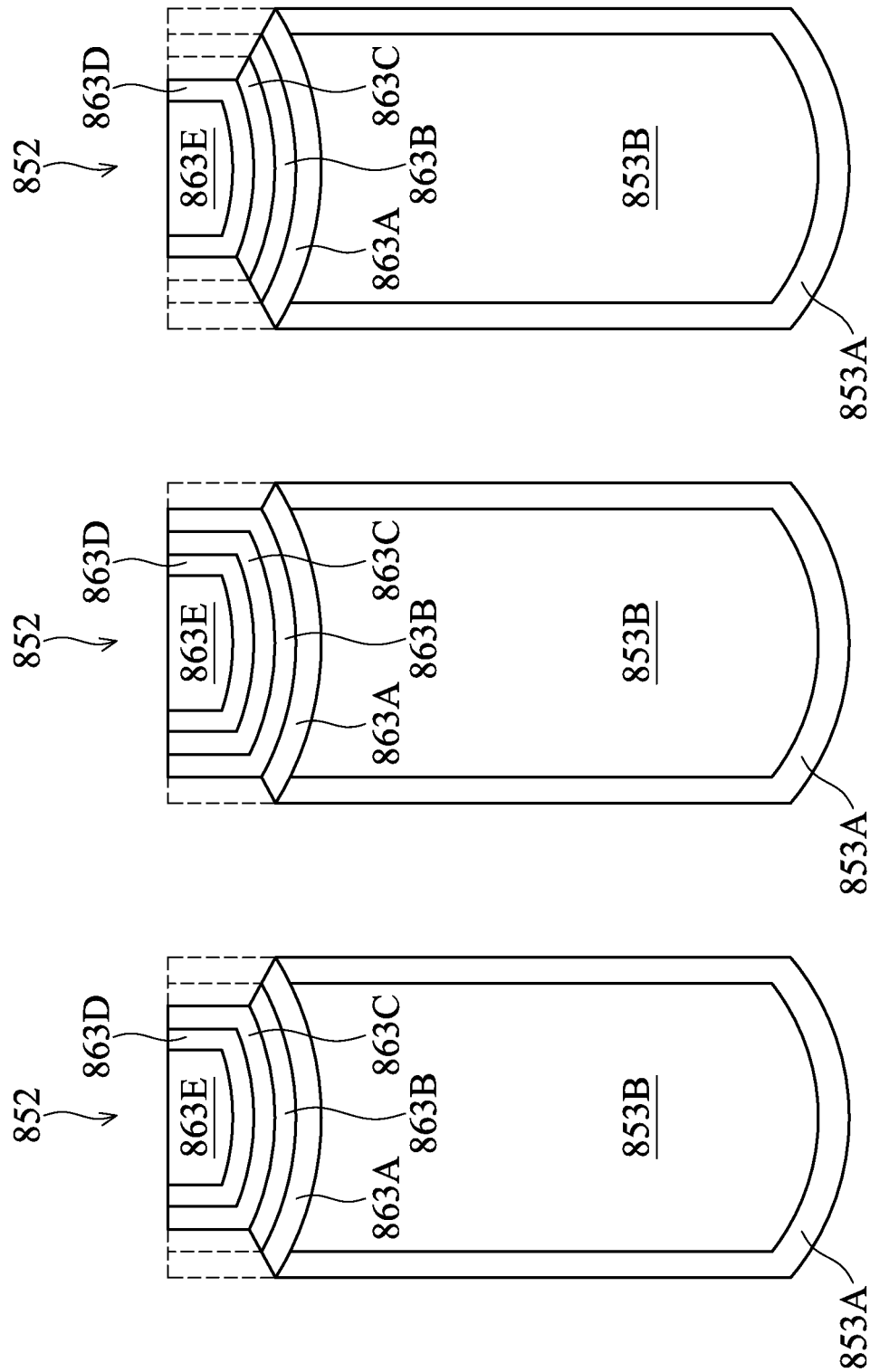

SEMICONDUCTOR DEVICES AND METHODS OF MANUFACTURING THEREOF

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4A, 4B, 5A, 5B, 6A, 6B, 7A, 7B, 8A, 8B, 9A, 9B, 10A, 10B, 11A, 11B, 12A, 12B, 13A, 13B, 14A, 14B, 14C, 15A, 15B, 15C, 15D, 15E, 15F, 15G, 15H, 15I, 15J, 15K, 16A, and 16B each illustrate a cross-sectional or top view of an example nanosheet FET device (or a portion of the example nanosheet FET device) during various fabrication stages, made by the method of FIG. 2, in accordance with some embodiments.

DETAILED DESCRIPTION

Figure 1:
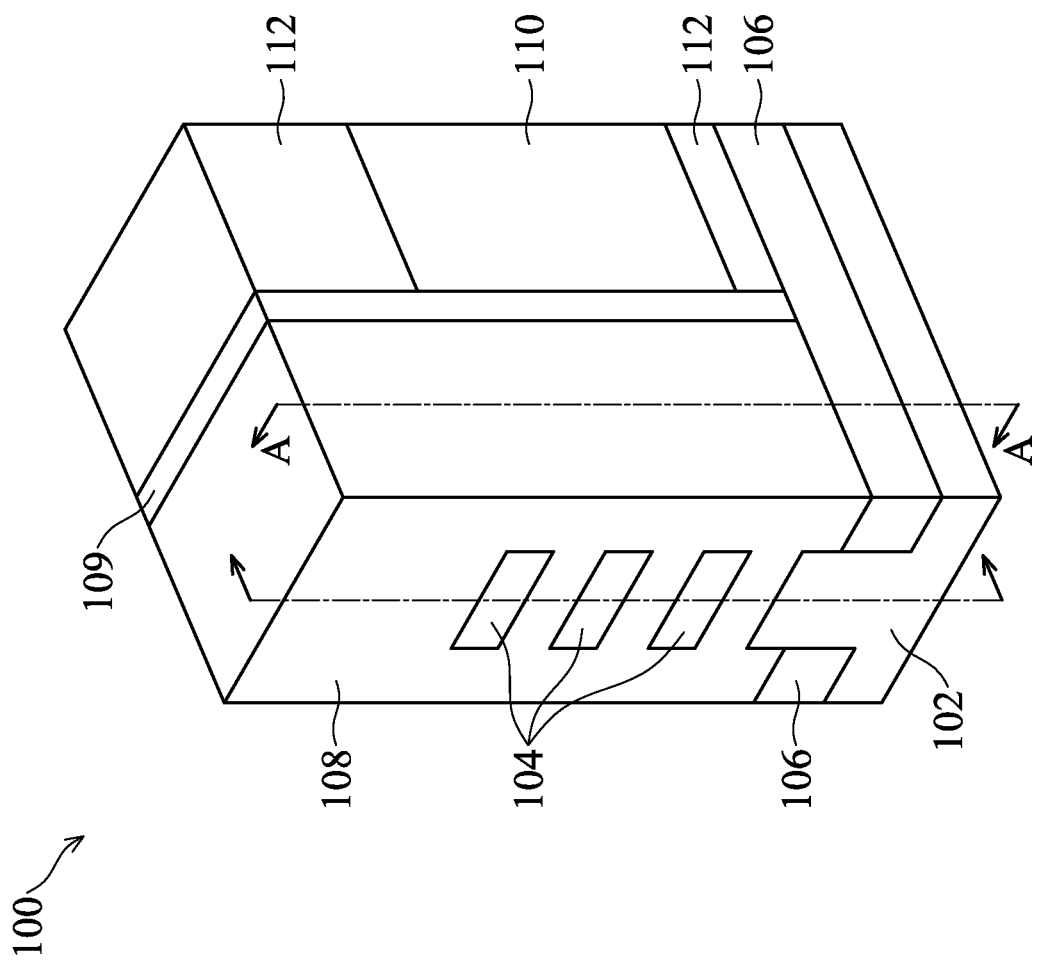
FIG. 1 illustrates a perspective view of a nanosheet field-effect-transistor (FET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In advanced technology nodes, a dummy fin can be disposed next to one or more active fins to improve the overall design and fabrication of an integrated circuit. The dummy fin generally stays inactive or electrically non-functional, when the integrated circuit is appropriately configured and powered. For example, the dummy fin can be formed between two adjacent active fins that are configured as respective channels of two adjacent transistors. The dummy fin with or without a corresponding gate isolation structure, can separate respective active (e.g., metal) gate structures of those two transistors.

Embodiments of the present disclosure are discussed in the context of forming a non-planar field-effect-transistor (FET) device (e.g., a fin-based FET device, a nanosheet FET device, etc.), and in particular, in the context of forming gates for a number of non-planar transistors. In some instances, a nanosheet FET device is also called as a gate-all-around FET device or a multiple bridge channel FET. The active gates can be separated by one or more isolation structures (e.g., dummy fins) in respective different profiles and dimensions. For example, a first group of transistors may have their respective active gate structures separated by a first dummy fin that keeps its profile as formed; and a second group of transistors may have their respective active gate structures separated by a second dummy fin that reshapes its profile after formed. In various embodiments, the first group of transistors may be formed in the high density area of a substrate, and the second group of transistors may be formed in the low density area of the substrate. By selectively reshaping the profile of the second dummy fin, a process window to form the active gate structures for the second group of transistors can be advantageously enlarged, without compromising the desired functionality of the second dummy fin.

FIG. 1 illustrates a perspective view of an example nanosheet FET device 100, in accordance with various embodiments. The nanosheet FET device 100 includes a substrate 102 and a number of semiconductor layers (e.g., nanosheets, nanowires, or otherwise nanostructures) 104 above the substrate 102. The semiconductor layers 104 are vertically separated from one another, which can collectively function as a (conduction) channel of the nanosheet FET device 100. Isolation regions/structures 106 are formed on opposing sides of a protruding portion of the substrate 102, with the semiconductor layers 104 disposed above the protruding portion. A gate structure 108 wraps around each of the semiconductor layers 104 (e.g., wrapping a perimeter of each of the semiconductor layers 104). A spacer 109 extends along each sidewall of the gate structure 108. Source/drain structures are disposed on opposing sides of the gate structure 108 with the spacer 109 disposed therebetween, e.g., one of such source/drain structures, 110, shown in FIG. 1. An interlayer dielectric (ILD) 112 is disposed over the source/drain structure 110 and/or between the source/drain structure 110 and the isolation structure 106.

The nanosheet FET device shown in FIG. 1 is simplified, and thus, it should be understood that one or more features of a completed nanosheet FET device may not be shown in FIG. 1. For example, the other source/drain structure opposite the gate structure 108 from the source/drain structure 110 and the ILD disposed over such a source/drain structure are not shown in FIG. 1. Further, FIG. 1 is provided as a reference to illustrate a number of cross-sections in subsequent figures. As indicated, cross-section A-A is cut along a longitudinal axis of the gate structure 108. At least some of the subsequent figures may refer to the reference cross-section for clarity.

Figure 2:
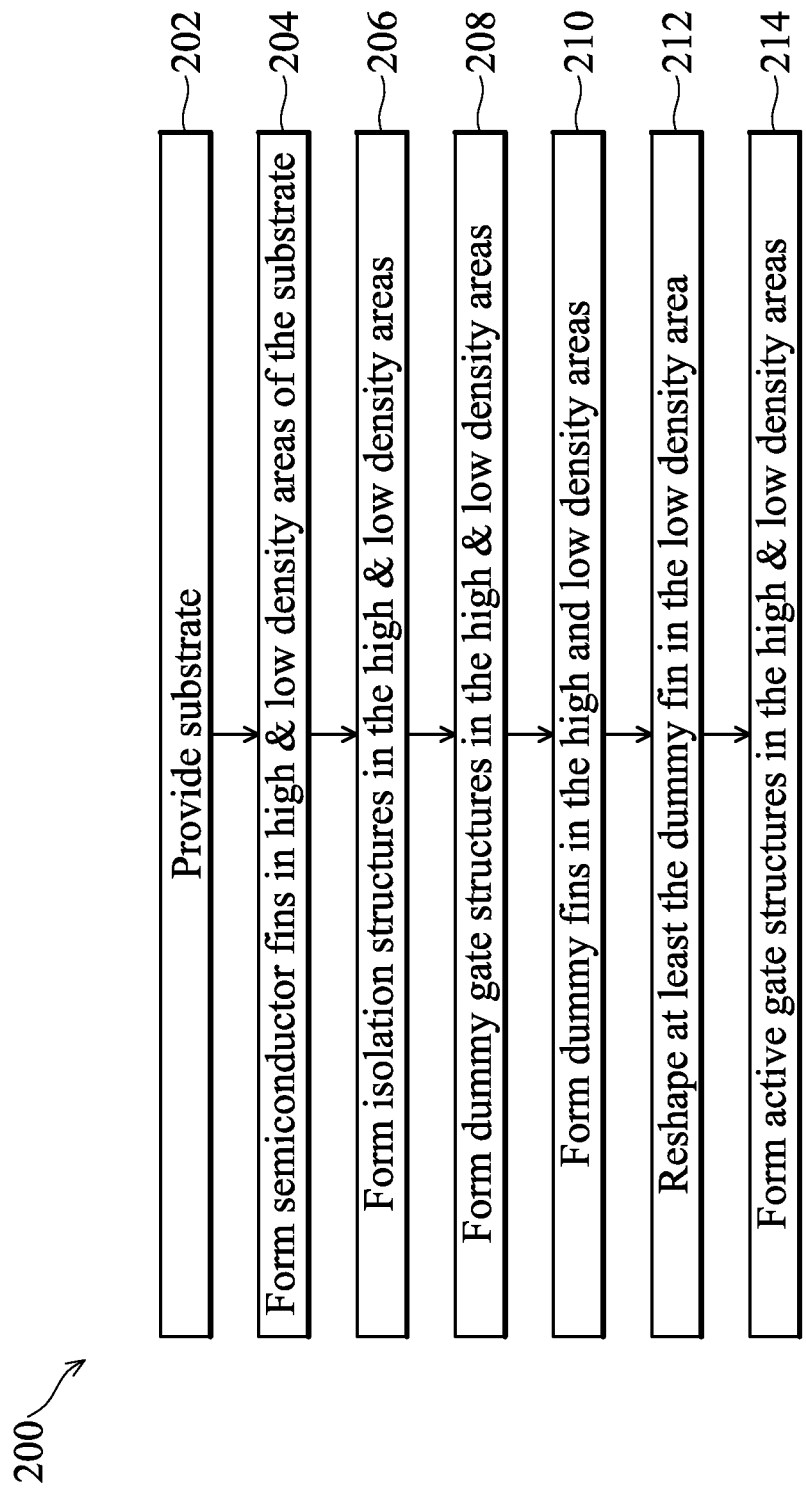
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device, a nanosheet FET device (e.g., nanosheet FET device 100), a nanosheet transistor device, a nanowire transistor device, a vertical transistor device, a gate-all-around (GAA) transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional or top views of an example nanosheet FET device at various fabrication stages as shown in FIGS. 3, 4A, 4B, 5A, 5B, 6A, 6B, 7A, 7B, 8A, 8B, 9A, 9B, 10A, 10B, 11A, 11B, 12A, 12B, 13A, 13B, 14A, 14B, 14C, 15A, 15B, 15C, 15D, 15E, 15F, 15G, 15H, 15I, 15J, 15K, 16A, and 16B, respectively, which will be discussed in further detail below.

In brief overview, the method 200 starts with operation 202 of providing a substrate. The method 200 continues to operation 204 of forming a number of semiconductor fins in a high density area and a number of semiconductor fins in a low density area, each of which includes a number of channel layers and a number of sacrificial layers. The method 200 continues to operation 206 of forming isolation structures in the high and low density areas, respectively. The method 200 continues to operation 208 of forming a number of dummy fins in the high and low density areas, respectively. The method 200 continues to operation 210 of forming a number of dummy gate structures in the high and low density areas, respectively. The method 200 continues to operation 212 of reshaping at least the dummy fin in the low density area. The method 200 continues to operation 214 of forming a number of active gate structures in the high and low density areas, respectively.

As mentioned above, FIGS. 3-16B each illustrate, in a cross-sectional view, a portion of a nanosheet FET device 300 at various fabrication stages of the method 200 of FIG. 2. The nanosheet FET device 300 is similar to the nanosheet FET device 100 shown in FIG. 1, but with certain features/structures/regions not shown, for the purposes of brevity. For example, the following figures of the nanosheet FET device 300 do not include source/drain structures (e.g., 110 of FIG. 1). It should be understood the nanosheet FET device 300 may further include a number of other devices (not shown in the following figures) such as inductors, fuses, capacitors, coils, etc., while remaining within the scope of the present disclosure.

Figure 3:
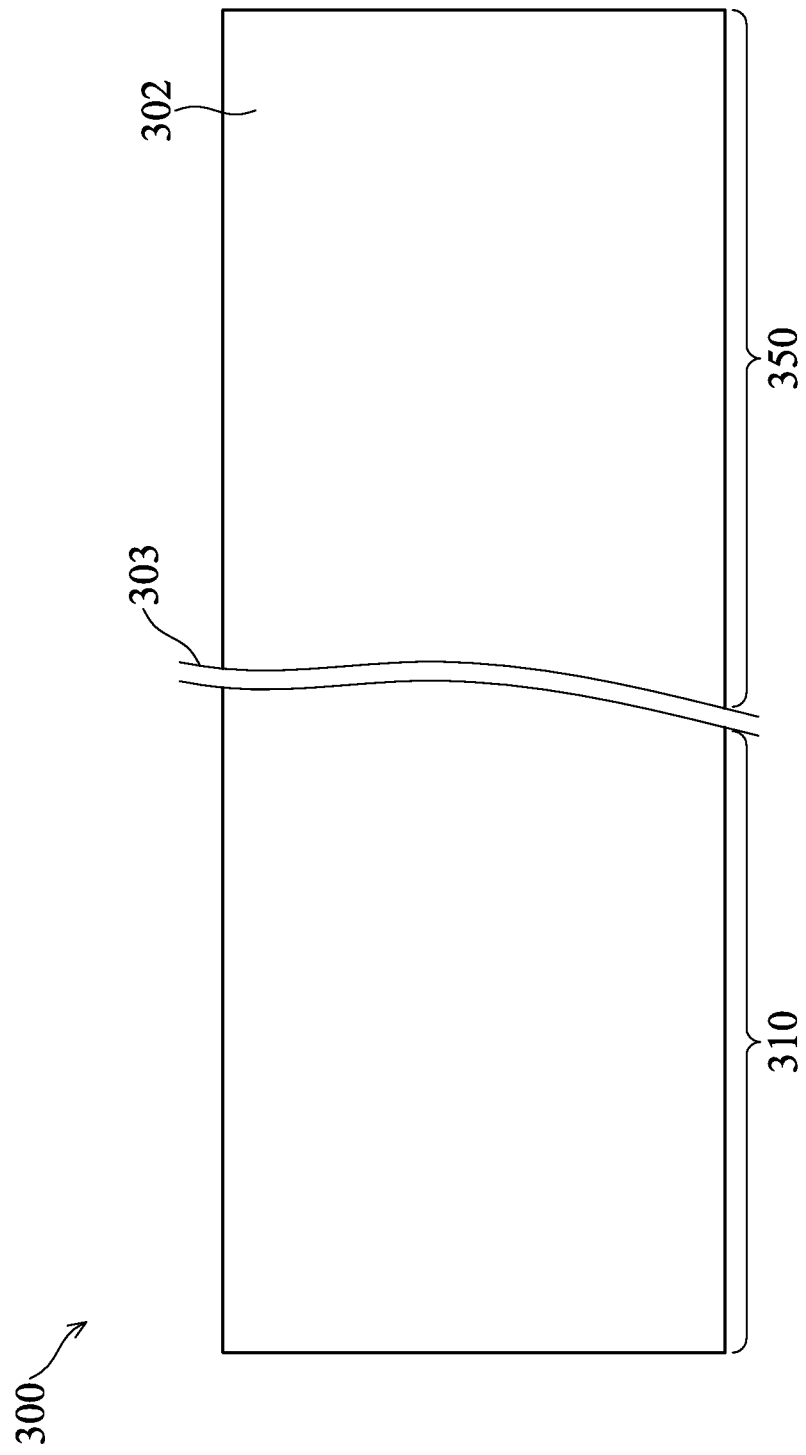

Corresponding to operation 202 of FIG. 2, FIG. 3 is a cross-sectional view of the nanosheet FET device 300 including a semiconductor substrate 302 at one of the various stages of fabrication. The cross-sectional view of FIG. 3 is cut in a direction along the lengthwise direction of an active/dummy gate structure of the nanosheet FET device 300 (e.g., cross-section A-A indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the substrate 302 can include areas 310 and 350. The area 310 can be configured to form a number of transistors in a relatively high transistor density (which is sometimes referred to as "high density area 310"); and the area 350 can be configured to form a number of transistors in a relatively low transistor density (which is referred to as "low density area 350"). Accordingly, features (e.g., fins, channels) of the transistors in the low density area 350 may be more sparsely formed, when compared to features (e.g., fins, channels) of the transistors formed in the high density area 310. As a non-limiting example, the transistors formed in the high density area 310 may function as, for example, logic circuits, static random access memory (SRAM) circuits, and/or ring oscillators (ROs). Such transistors formed in the area 310 may sometimes be referred to as core transistors. The transistors formed in the low density area 350 may functions as, for example, input/output (I/O) circuits, and/or serializer/deserializer (SerDes). Such transistors formed in the area 350 may sometimes be referred to as I/O transistors.

As shown in FIG. 3, the high density area 310 and low density area 350 are separated from each other by a divider 303, which can include additional features/components/devices that are omitted for simplicity. It should be appreciated that some of the operations of the method 200 may be concurrently performed in the areas 310 and 350. For purposes of illustration, the feature(s) formed in the areas 310 and 350 may be shown in the respective figures that correspond to one of the operations of the method 200.

In general, the terms "I/O transistor" and "core transistor," as used herein, may be generally referred to a transistor configured to operate under a relatively higher voltage (e.g., higher $V_{gs}$) and a transistor configured to operate under a relatively lower voltage (e.g., lower $V_{gs}$), respectively. Thus, it should be understood that the I/O transistor can include any of various other transistors operating under a relatively higher voltage and the core transistor can include any of various other transistors operating under a relatively lower voltage, while remaining within the scope of the present disclosure.

Figure 4A:
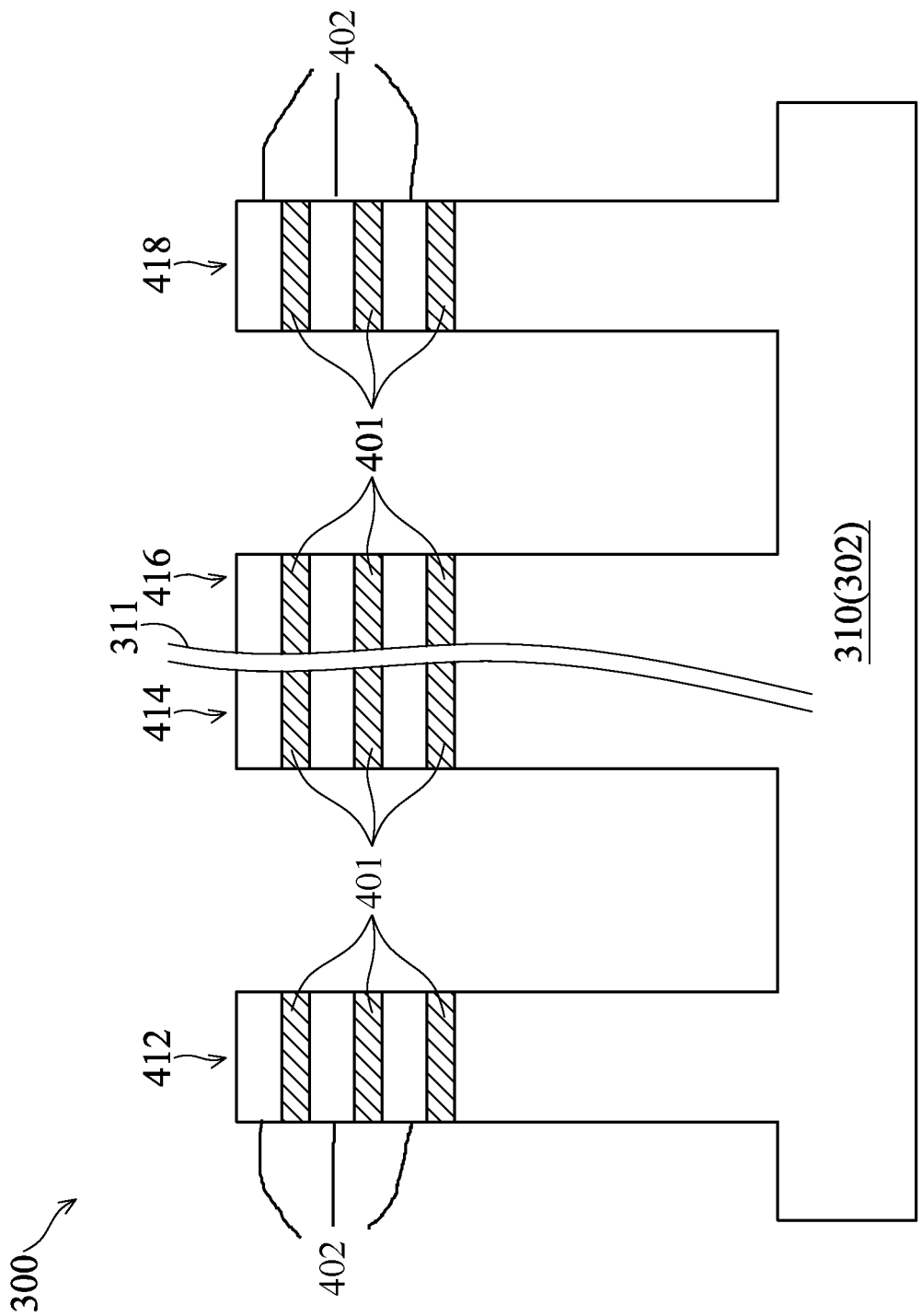
Figure 4B:
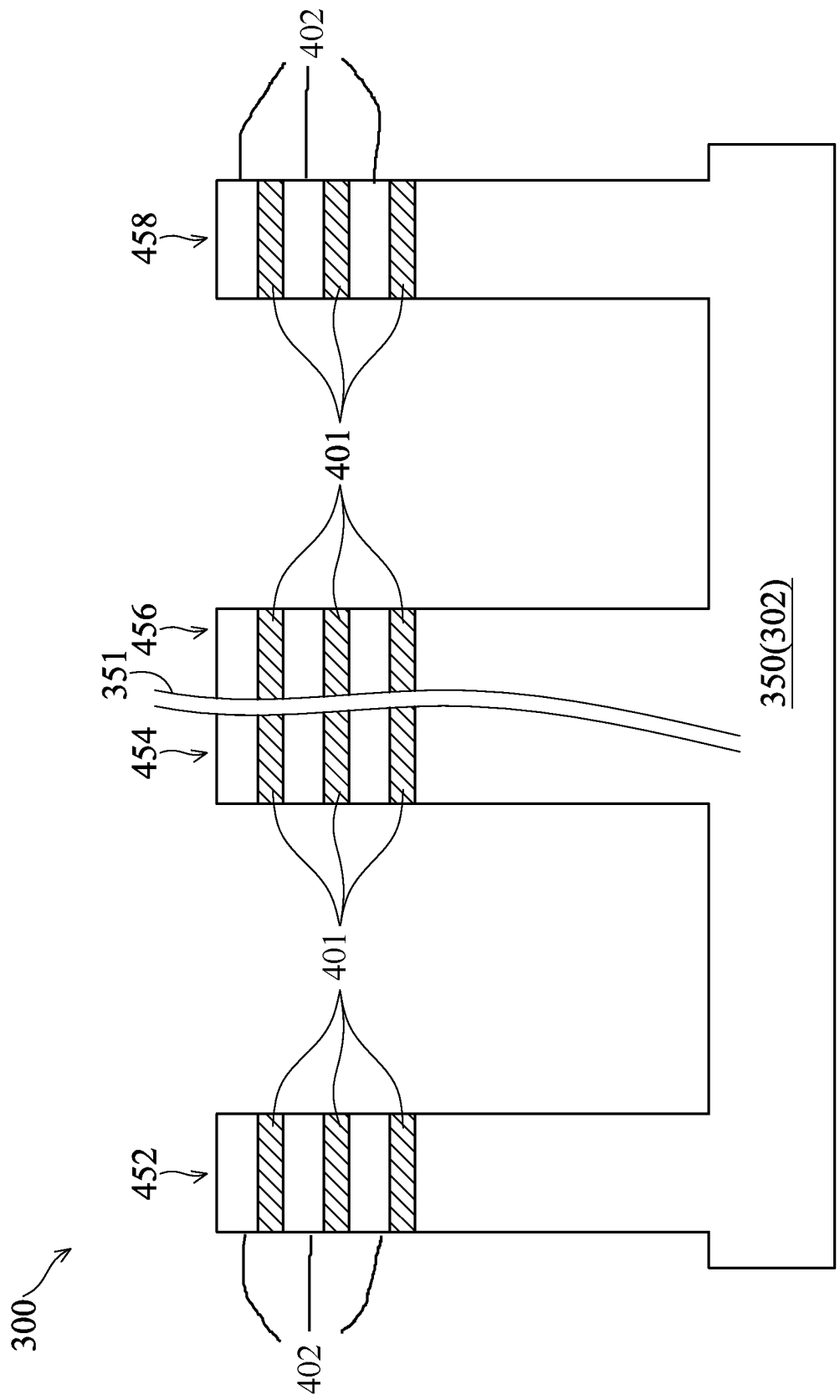

Corresponding to operation 204 of FIG. 2, FIG. 4A is a cross-sectional view of the nanosheet FET device 300 including semiconductor fins (structures) 412, 414, 416, and 418 formed in the area 310, and FIG. 4B is a cross-sectional view of the nanosheet FET device 300 including fins (structures) 452, 454, 456, and 458 formed in the area 350, at one of the various stages of fabrication. The cross-sectional views of FIGS. 4A-B are each cut in a direction along the lengthwise direction of an active/dummy gate structure of the nanosheet FET device 300 (e.g., cross-section A-A indicated in FIG. 1).

To form the semiconductor fins 412-418 and 452-458, a number of first semiconductor layers 401 and a number of second semiconductor layers 402 are alternatingly disposed on top of one another to form a stack. For example, one of the second semiconductor layers 402 is disposed over one of the first semiconductor layers 401 then another one of the first semiconductor layers 401 is disposed over the second semiconductor layer 402, so on and so forth. The stack may include any number of alternately disposed first and second semiconductor layers 401 and 402. For example in the illustrated embodiments of FIGS. 4A-B (and the following figures), the stack may include 3 first semiconductor layers 401, with 3 second semiconductor layers 402 alternatingly disposed therebetween and with one of the second semiconductor layers 402 being the topmost semiconductor layer. In at least one embodiment, the second semiconductor layers 402 can function as stacked channels in a nanosheet transistor. It should be understood that the nanosheet FET device 300 can include any number of first semiconductor layers and any number of second semiconductor layers, with either one of the first or second semiconductor layers being the topmost semiconductor layer, while remaining within the scope of the present disclosure.

The semiconductor layers 401 and 402 may have respective different thicknesses. Further, the first semiconductor layers 401 may have different thicknesses from one layer to another layer. The second semiconductor layers 402 may have different thicknesses from one layer to another layer. The thickness of each of the semiconductor layers 401 and 402 may range from few nanometers to few tens of nanometers. The first layer of the stack may be thicker than other semiconductor layers 401 and 402. In an embodiment, each of the first semiconductor layers 401 has a thickness ranging from about 5 nanometers (nm) to about 20 nm, and each of the second semiconductor layers 402 has a thickness ranging from about 5 nm to about 20 nm.

The two semiconductor layers 401 and 402 may have different compositions. In various embodiments, the two semiconductor layers 401 and 402 have compositions that provide for different oxidation rates and/or different etch selectivity between the layers. In an embodiment, the first semiconductor layers 401 may each include silicon germanium ($Si_{1-x}Ge_x$), and the second semiconductor layers may each include silicon (Si). In an embodiment, each of the semiconductor layers 402 is silicon that may be undoped or substantially dopant-free (i.e., having an extrinsic dopant concentration from about 0 $cm^{-3}$ to about $1\times10^{17}$ $cm^{-3}$), where for example, no intentional doping is performed when forming the layers 402 (e.g., of silicon).

In some embodiments, each of the semiconductor layers 401 is $Si_{1-x}Ge_x$ that includes less than 50% (x<0.5) Ge in molar ratio. For example, Ge may comprise about 15% to 35% of the semiconductor layers 401 of $Si_{1-x}Ge_x$ in molar ratio. Furthermore, the first semiconductor layers 401 may include different compositions among them, and the second semiconductor layers 402 may include different compositions among them. Either of the semiconductor layers 401 and 402 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 401 and 402 may be chosen based on providing differing oxidation rates and/or etch selectivity.

The semiconductor layers 401 and 402 can be epitaxially grown from the semiconductor substrate 302. For example, each of the semiconductor layers 401 and 402 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 302 extends upwardly, resulting in the semiconductor layers 401 and 402 having the same crystal orientation with the semiconductor substrate 302.

Upon growing the semiconductor layers 401 and 402 on the semiconductor substrate 302 (as a stack), the stack may be patterned to form the semiconductor fins 412-418 and 452-458, as shown in FIGS. 4A-B. Each of the semiconductor fins is elongated along a lateral direction, and includes a stack of patterned semiconductor layers 401-402 interleaved with each other. The semiconductor fins are formed by patterning the stack of semiconductor layers 401-402 and the semiconductor substrate 302 using, for example, photolithography and etching techniques.

For example, a mask layer (which can include multiple layers such as, for example, a pad oxide layer and an overlying hardmask layer) is formed over the topmost semiconductor layer of the stack (e.g., 402 in FIGS. 4A-B). The pad oxide layer may be a thin film comprising silicon oxide formed, for example, using a thermal oxidation process. The pad oxide layer may act as an adhesion layer between the topmost semiconductor layer 402 and the hardmask layer. In some embodiments, the hardmask layer may include silicon nitride, silicon oxynitride, silicon carbonitride, the like, or combinations thereof. In some other embodiments, the hardmask layer may include a material similar as a material of the semiconductor layers 401/402 such as, for example, $Si_{1-y}Ge_y$, Si, etc., in which the molar ratio (y) may be different from or similar to the molar ratio (x) of the semiconductor layers 401. The hardmask layer may be formed over the stack (i.e., before patterning the stack) using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask can be subsequently used to pattern exposed portions of the semiconductor layers 401-402 and the substrate 302 to form the semiconductor fins 412-418 in the area 310 and the semiconductor fin 452-458 in the area 350, respectively, thereby defining trenches (or openings) between adjacent semiconductor fins. When multiple semiconductor fins are formed, such a trench may be disposed between any adjacent ones of the semiconductor fins. In some embodiments, the semiconductor fins are formed by etching trenches in the semiconductor layers 401-402 and substrate 302 using, for example, reactive ion etch (ME), neutral beam etch (NBE), the like, or combinations thereof. The etch may be anisotropic. In some embodiments, the trenches may be strips (when viewed from the top) parallel to each other, and closely spaced with respect to each other. In some embodiments, the trenches may be continuous and surround the respective semiconductor fins.

As shown in FIGS. 4A-B (and some of the following figures), the semiconductor fins 412 to 418 in the area 310 are separated into two groups by a divider 311, and the semiconductor fins 452 to 458 in the area 350 are separated into two groups by a divider 351. Such two groups in each of the areas 310 and 350 can represent a sharing gate configuration and an separate gate configuration, respectively, which will be discussed in further detail below. It should be understood that each of the dividers 311 and 351 can include additional features/components/devices that are omitted for simplicity.

Figure 5A:
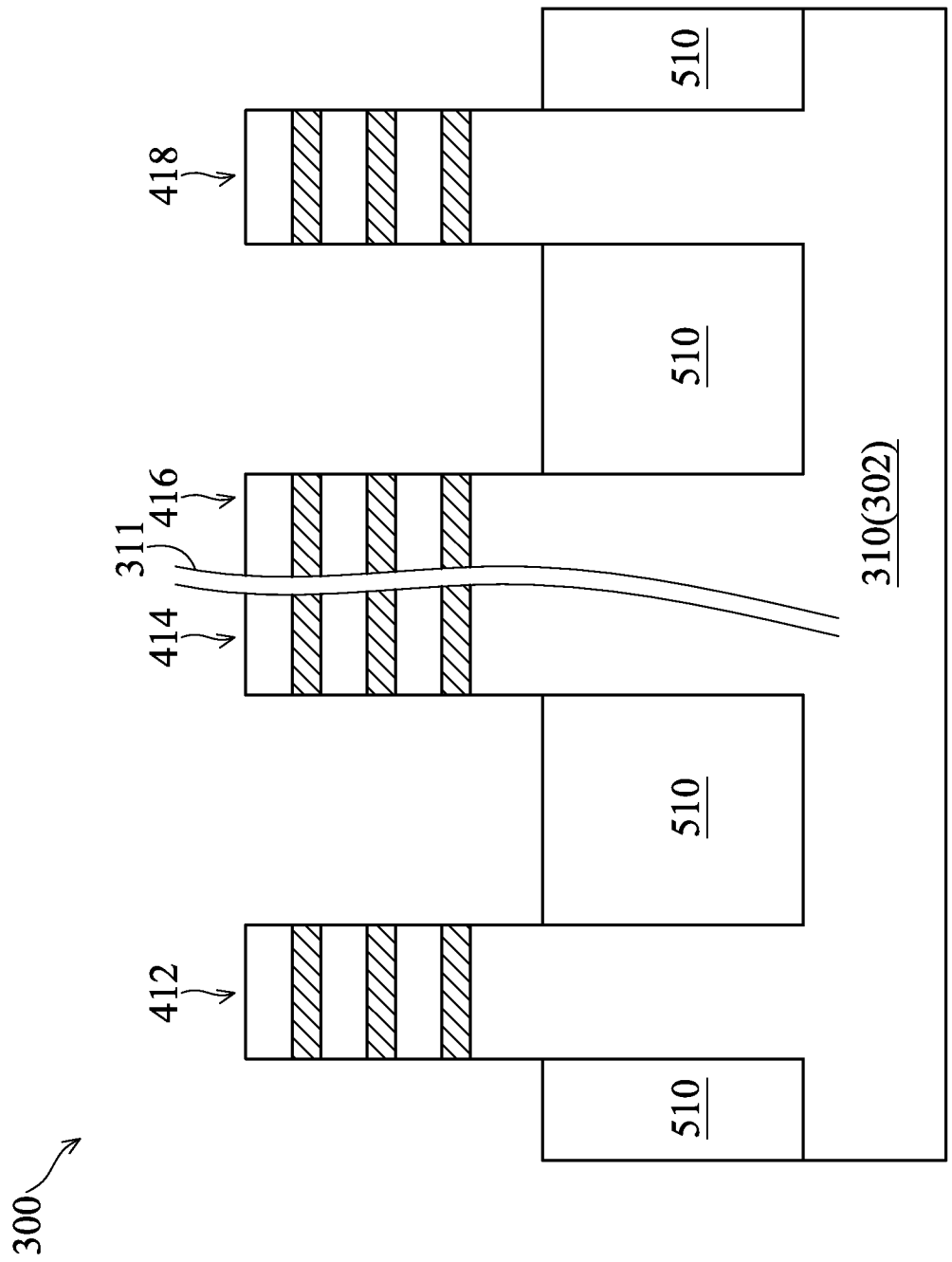
Figure 5B:
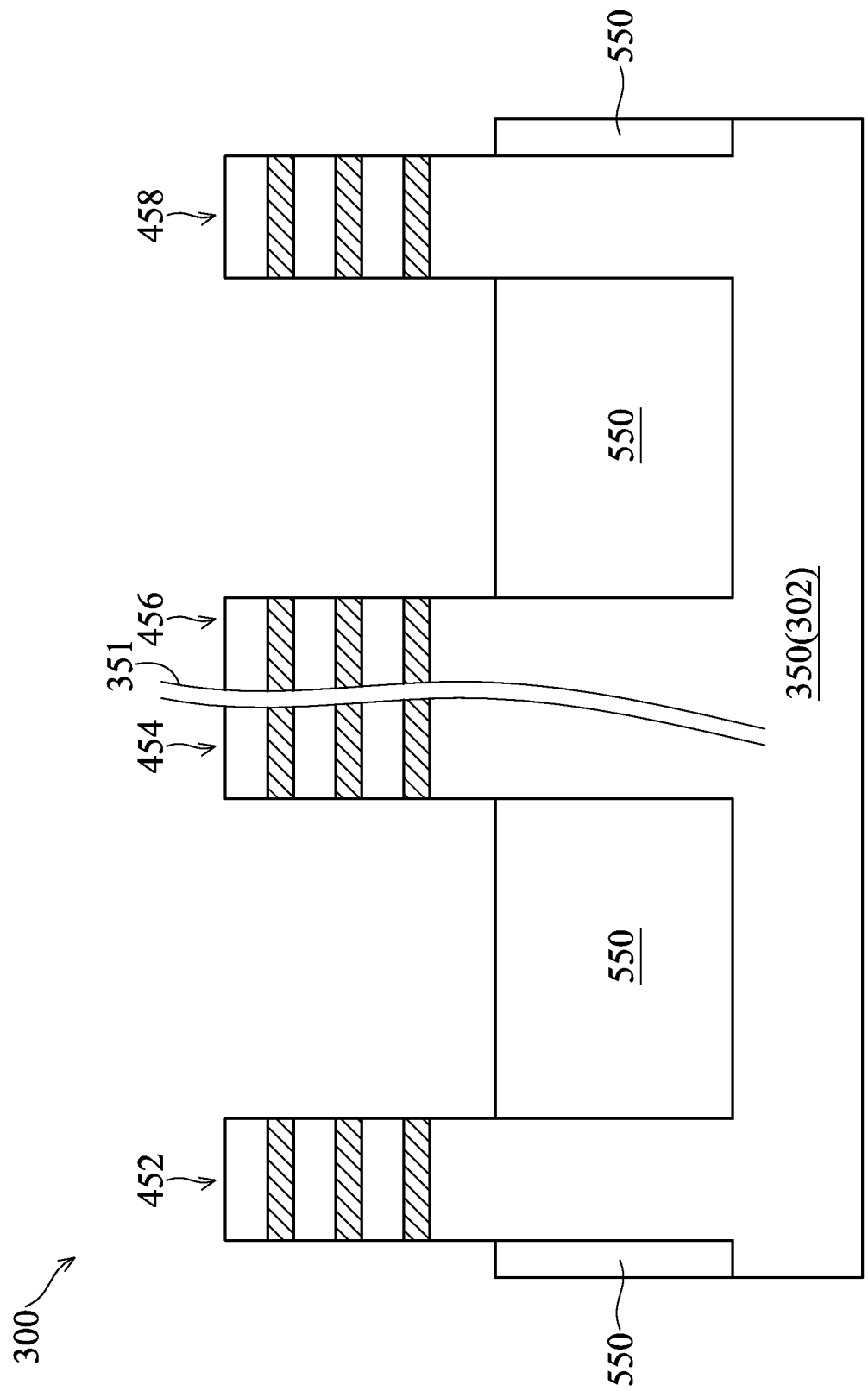

Corresponding to operation 206 of FIG. 2, FIG. 5A is a cross-sectional view of the nanosheet FET device 300 including one or more isolation structures 510 in the area 310, and FIG. 5B is a cross-sectional view of the nanosheet FET device 300 including one or more isolation structures 550 in the area 350, at one of the various stages of fabrication. The cross-sectional views of FIGS. 5A-B are each cut in a direction along the lengthwise direction of an active/dummy gate structure of the nanosheet FET device 300 (e.g., cross-section A-A indicated in FIG. 1).

To form the isolation structures 510 and 550, an insulation material may be universally deposited over the workpiece, which includes the semiconductor fins 412-418 and 452-458. For example, the insulation material may overlay the semiconductor fins by extending along their respective sidewalls and overlaying their respective top surfaces. In some embodiments, the insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP) process, may remove any excess insulation material and form a top surface of the insulation material and a top surface of a patterned mask (not shown) defining the semiconductor fins. The patterned mask may also be removed by the planarization process, in various embodiments.

Next, the insulation material is recessed to form the isolation structure 510 in the area 310 and isolation structure 550 in the area 350, as shown in FIGS. 5A-B. The isolation structures 510 and 550 are sometimes referred to as shallow trench isolation (STI) 510 and 550, respectively. The isolation structures 510 and 550 are recessed such that the semiconductor fins 412-418 and 452-458 each protrude from between neighboring portions of the isolation structures 510 and 550. The top surface of the isolation structures (STIs) 510 and 550 may have a flat surface (as illustrated), a convex surface, a concave surface (such as dishing), or combinations thereof. The top surface of the isolation structures 510 and 550 may be formed flat, convex, and/or concave by an appropriate etch. The isolation structures 510 and 550 may be recessed using an acceptable etching process, such as one that is selective to the insulation material of the isolation structures 510 and 550. For example, a dry etch or a wet etch using dilute hydrofluoric (DHF) acid may be performed to form the isolation structures 510 and 550.

Figure 6A:
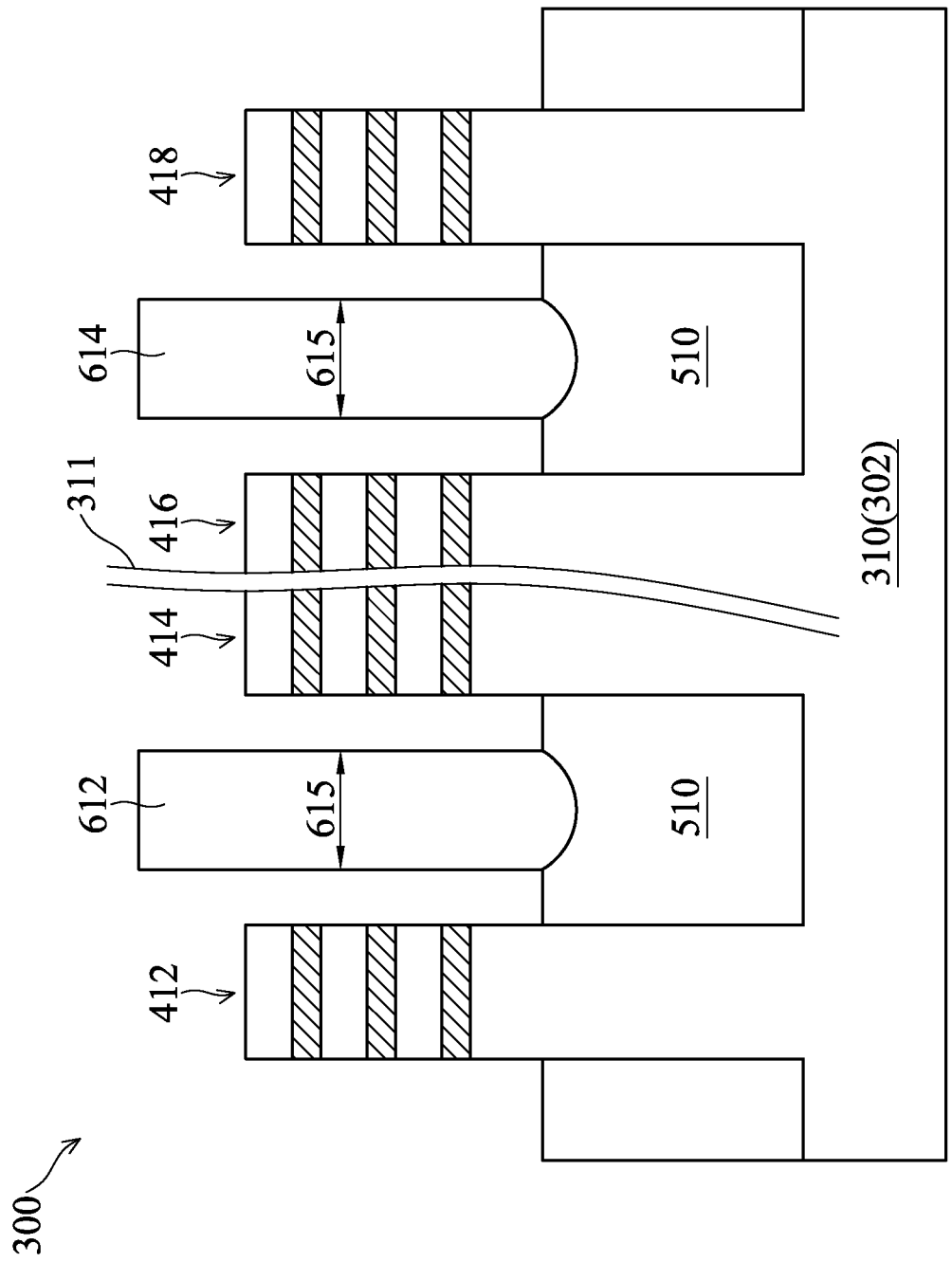
Figure 6B:
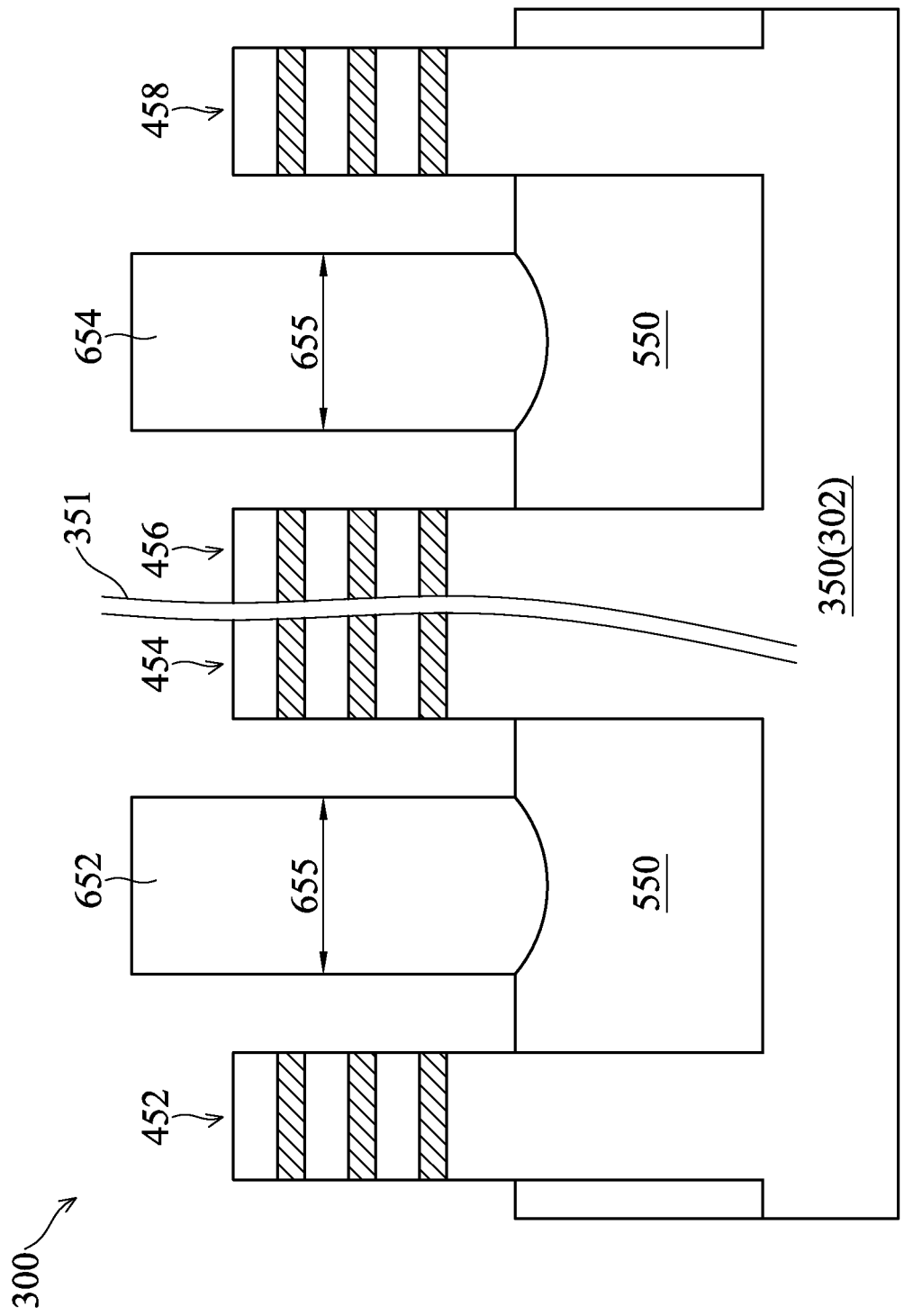

Corresponding to operation 208 of FIG. 2, FIG. 6A is a cross-sectional view of the nanosheet FET device 300 including dummy fins 612 and 614 in the area 310, and FIG. 6B is a cross-sectional view of the nanosheet FET device 300 including dummy fins 652 and 654 in the area 350, at one of the various stages of fabrication. The cross-sectional views of FIGS. 6A-B are each cut in a direction along the lengthwise direction of an active/dummy gate structure of the nanosheet FET device 300 (e.g., cross-section A-A indicated in FIG. 1).

In some embodiments, each of the dummy fins 612-614 and 652-654 may extend along the same lengthwise direction of the semiconductor fins 412-418 and 452-458. When viewed from the top, the semiconductor fins and dummy fins may be parallel to one another. In the area 310, the dummy fin 612 is formed between the semiconductor fins 412 and 414; and the dummy fin 614 is formed between the semiconductor fins 416 and 418. In the area 350, the dummy fin 652 is formed between the semiconductor fins 452 and 454; and the dummy fin 654 is formed between the semiconductor fins 456 and 458. Further, the dummy fins 612 and 614 may be formed higher than the semiconductor fins 412-418, and the dummy fins 652 and 654 may be formed higher than the semiconductor fins 452-458, in various embodiments. Although the dummy fins 612-614 and 652-654 are each formed as a continuous one-piece structure in the illustrated embodiments of FIGS. 6A-B, it should be understood that each of the dummy fins can include a number of dielectric layers stacked on top of one another, while remaining within the scope of the present disclosure. For example, each of the dummy fins 612-614 and 652-654 can include a U-shaped lower layer that forms the dummy fin's bottom surface and sidewalls, and at least one upper layer disposed above the U-shaped lower layer.

As illustrated in FIG. 6A, the dummy fins 612 and 614 formed in the area 310 has a width (along a direction perpendicular to a lengthwise direction of the semiconductor fins) 615, and the dummy fins 652 and 654 formed in the area 350 has a width (along a direction perpendicular to a lengthwise direction of the semiconductor fins) 655. In various embodiments, the width 655 is substantially greater than the width 615. For example with a certain process node, the width 655 can range from about 2 nanometers (nm) to about 200 nm, and the width 615 can range from about 2 nm to about 50 nm.

The dummy fins 612-614 and 652-654 can include a dielectric material. The dummy fins 612-614 and 652-654 may sometimes be referred to as dielectric fins 612-614 and 652-654, respectively. For example, the dielectric material may include silicon oxide, silicon nitride, silicon oxynitride, silicon carbide, silicon carbonitride, silicon oxycarbonitride, silicon oxycarbide, or combinations thereof. In another example, the dielectric material may include an oxide-based or nitride-based material, e.g., aluminum oxide, tantalum nitride, tantalum oxide, hafnium oxide, or combinations thereof.

The dummy fins 612-614 and 652-654 may be formed prior to, concurrently with, or subsequently to the formation of the isolation regions 510 and 550. Details of various example methods to form the dummy fins 612-614 and 652-654 will be respectively discussed as follows.

As an example, upon forming the semiconductor fins 412-418 and 452-458, the above-mentioned dielectric material (of the dummy fins 612-614 and 652-654) may be universally deposited over the workpiece as a blanket dummy layer, using low-pressure chemical vapor deposition (LPCVD) or plasma enhanced chemical vapor deposition (PECVD), for example. The dummy fins 612-614 and 652-654 can be formed by patterning the blanket dummy layer using, for example, photolithography and etching techniques. For example, a patterned mask (not shown) may be formed over the blanket dummy layer to mask portions of the dummy channel layer to form the dummy fins 612-614 and 652-654. Subsequently, unmasked portions of the blanket dummy layer may be etched using, for example, reactive ion etch (RIE), neutral beam etch (NBE), the like, or combinations thereof, thereby defining the dummy fins 612-614 and 652-654, each of which is disposed between adjacent one of the semiconductor fins 412-418 and 452-458. The etch may be anisotropic, in some embodiments. In such embodiments, the dummy fins 612-614 and 652-654 may each have a lower portion extending through the isolation regions 510 and 550.

As another example, when forming the semiconductor fins 412-418 and 452-458 (FIGS. 4A-B), one or more other semiconductor fins may also be formed in each of the trenches between the adjacent semiconductor fins. Next, the insulation material of the isolation regions 510/550 may be deposited over the semiconductor fins, followed by a CMP process to planarize the top surfaces of the insulation material and the semiconductor fins. Next, an upper portion of each of the semiconductor fins formed in the trenches may be partially removed to form cavity. The cavity is then filled with the dielectric material (of the dummy fins 612-614 and 652-654), followed by another CMP process to form the dummy fins 612-614 and 652-654. The insulation material is then recessed to form the shallow trench isolation (STI) 510/550. Using such a method to form the dummy fins, the dummy fins 612-614 and 652-654 may not be disposed over the isolation regions 510/550, but over the substrate 302 (e.g., a remaining portion of the semiconductor fin formed in the trench between the adjacent semiconductor fins 412-414, 416-418, 452-454, or 456-458).

As yet another example, after forming the semiconductor fins 412-418 and 452-458 (FIGS. 4A-B), the insulation material of the isolation regions 510/550 may be deposited over the semiconductor fins 412-418 and 452-458 in a controlled deposition rate, thereby causing a cavity to be spontaneously formed in the trenches. The cavity is then filled with the dielectric material (of the dummy fins 612-614 and 652-654), followed by a CMP process to form the dummy fins 612-614 and 652-654. The insulation material is then recessed to form the shallow trench isolation (STI) 510/550, as shown in FIGS. 6A-B. In particular, the dummy fins 612-614 and 652-654 are formed on the isolation regions 510/550 and a bottom surface of each of the dummy fins is embedded in the corresponding isolation region 510/550.

Figure 7A:
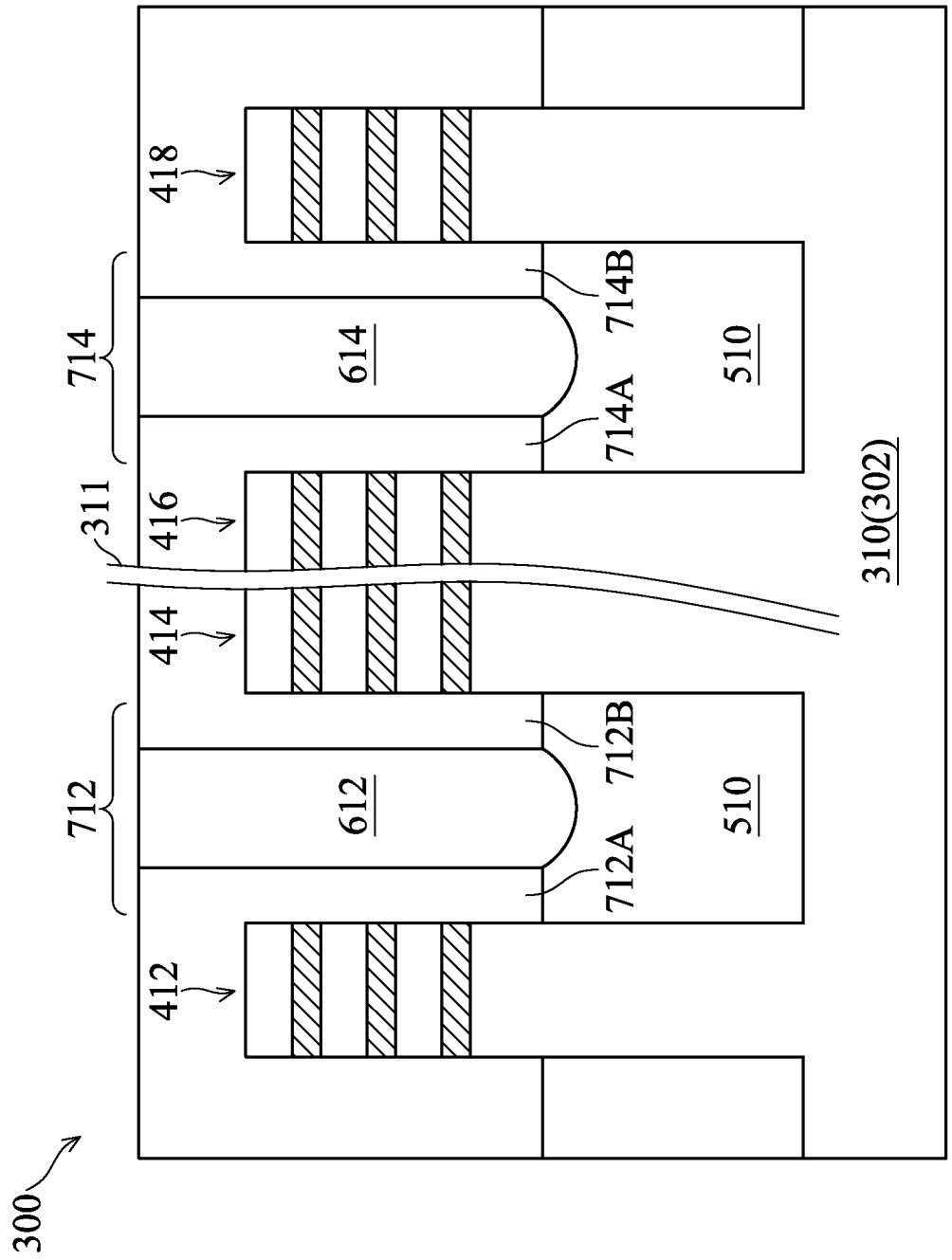
Figure 7B:
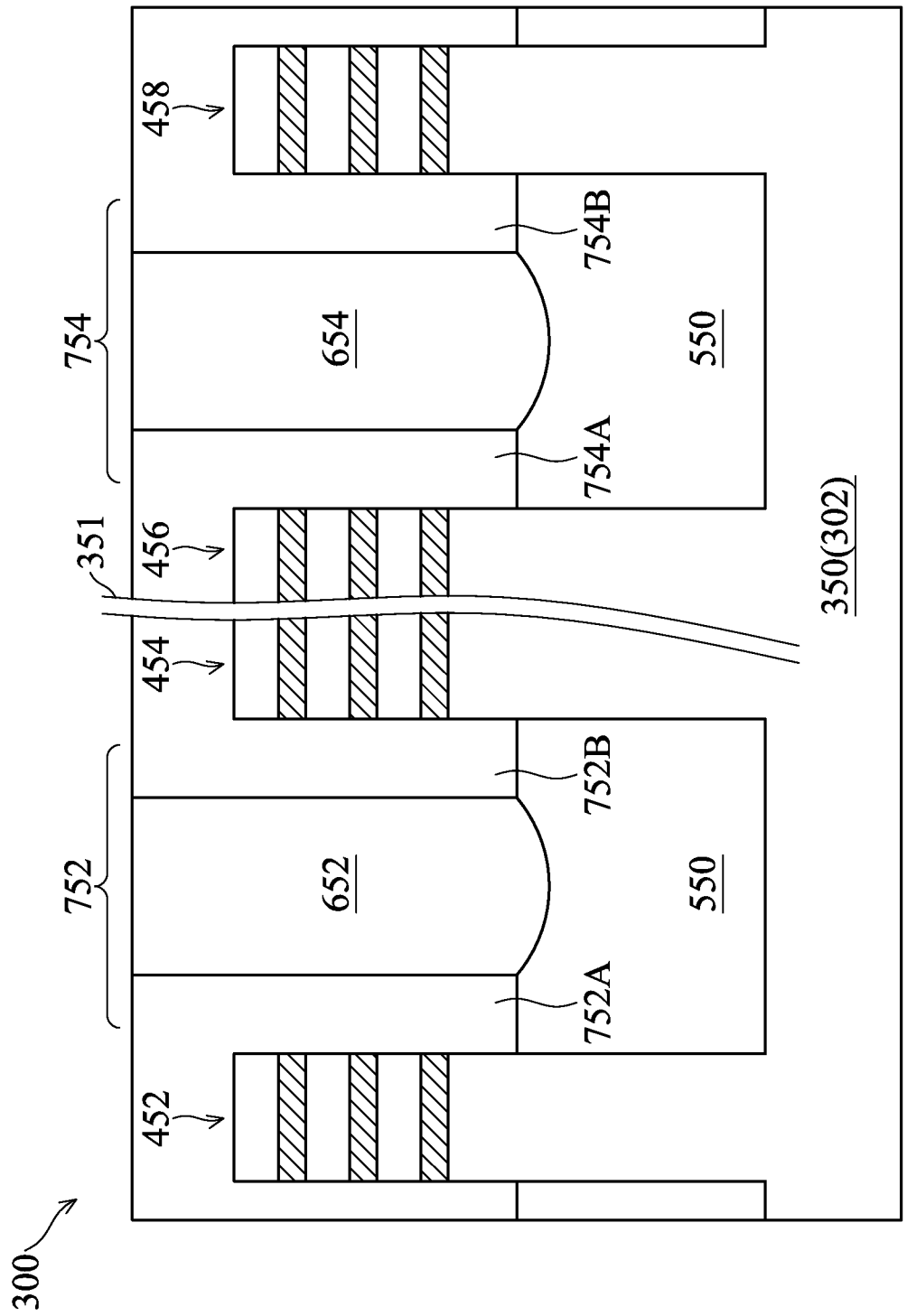

Corresponding to operation 210 of FIG. 2, FIG. 7A is a cross-sectional view of the nanosheet FET device 300 including dummy gate structures 712 and 714 in the area 310, and FIG. 7B is a cross-sectional view of the nanosheet FET device 300 including dummy gate structures 752 and 754 in the area 350, at one of the various stages of fabrication. The cross-sectional views of FIGS. 7A-B are each cut in a direction along the lengthwise direction of an active/dummy gate structure of the nanosheet FET device 300 (e.g., cross-section A-A indicated in FIG. 1).

The dummy gate structures 712-714 and 752-754 may have a lengthwise direction (e.g., along direction A-A in FIG. 1) perpendicular to the lengthwise direction of the semiconductor/dummy fins. As, in some embodiments, the dummy fins can be formed higher than the semiconductor fins, each of the dummy gate structures 712-714 and 752-754 may be separated into different portions by the dummy fins. As shown, in the area 310, the dummy gate structures 712 includes portions 712A and 712B (hereinafter "dummy gate portions 712A and 712B") that overlay (e.g., straddle) a portion of the semiconductor fins 412 and 414, respectively; and the dummy gate structures 714 includes portions 714A and 714B (hereinafter "dummy gate portions 714A and 714B") that overlay (e.g., straddle) a portion of the semiconductor fins 416 and 418, respectively. Similarly, in the area 350, the dummy gate structures 752 includes portions 752A and 752B (hereinafter "dummy gate portions 752A and 752B") that overlay (e.g., straddle) a portion of the semiconductor fins 452 and 454, respectively; and the dummy gate structures 754 includes portions 754A and 754B (hereinafter "dummy gate portions 754A and 754B") that overlay (e.g., straddle) a portion of the semiconductor fins 456 and 458, respectively. As a representative example, the dummy gate portion 712A may straddle a central portion of the semiconductor fin 412, such that end or side portions of the semiconductor fin 412 are exposed. The exposed portions of the semiconductor fin may be later replaced with source/drain structures, respectively.

The dummy gate structures 712-714 and 752-754 may each include a dummy gate dielectric and a dummy gate, which are not shown separately for purpose of clarity. To form the dummy gate structures 712-714 and 752-754, a dielectric layer may be formed over the workpiece. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques. Next, the pattern of the mask layer may be transferred to the gate layer and the dielectric layer by a suitable etching technique to form the dummy gate structures 712-714 and 752-754.

As indicated in the method 200 of FIG. 2, the order of operations 208 and 210 may be changed. For example, a number of dummy fins may be formed between the adjacent semiconductor fins subsequently to the formation of dummy gate structures (e.g., 712-714 and 752-754), which will be described in conjunction with cross-sectional views of FIGS. 8A-8B, 9A-9B, 10A-10B, and 11A-11B.

Figure 8A:
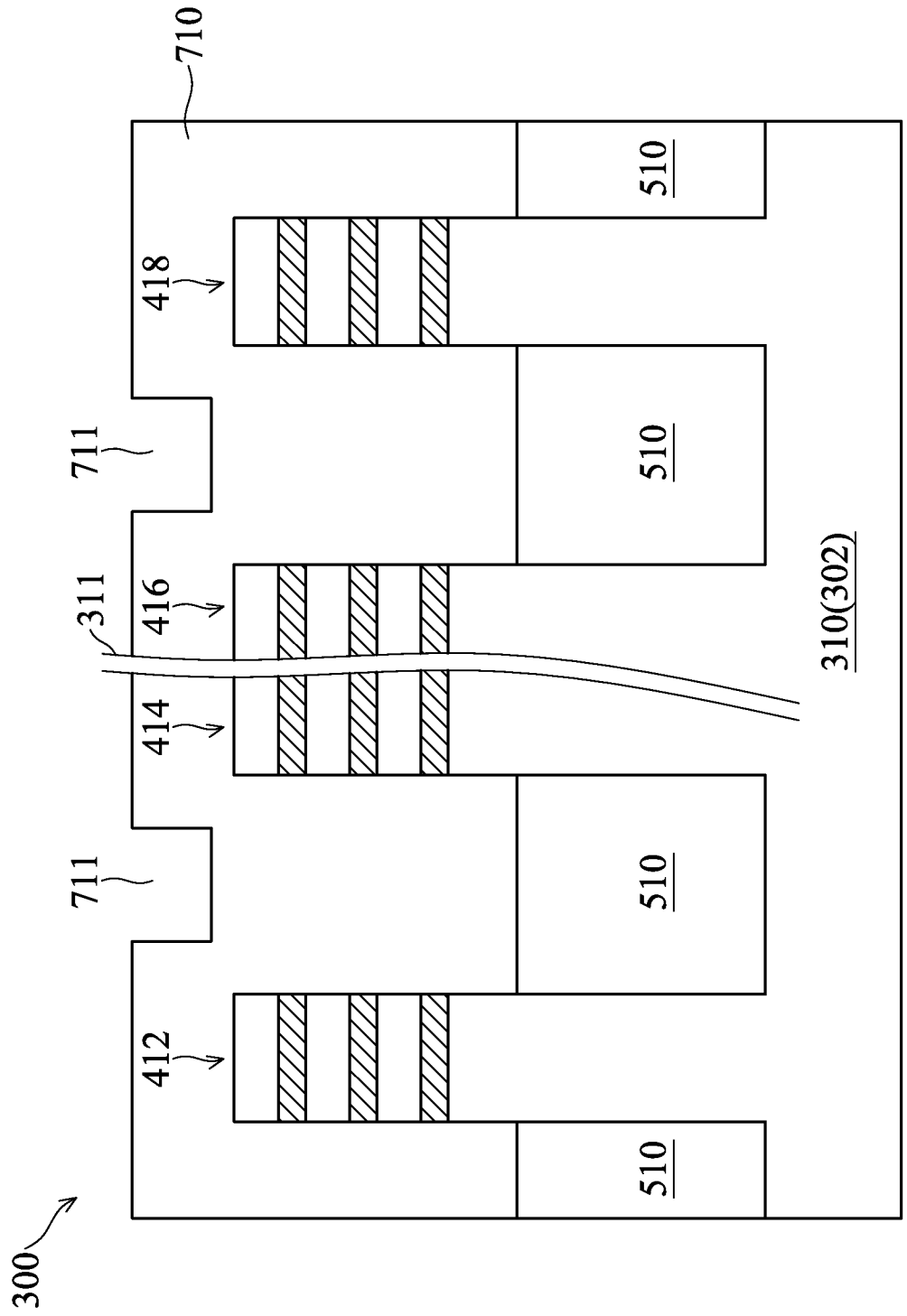
Figure 8B:
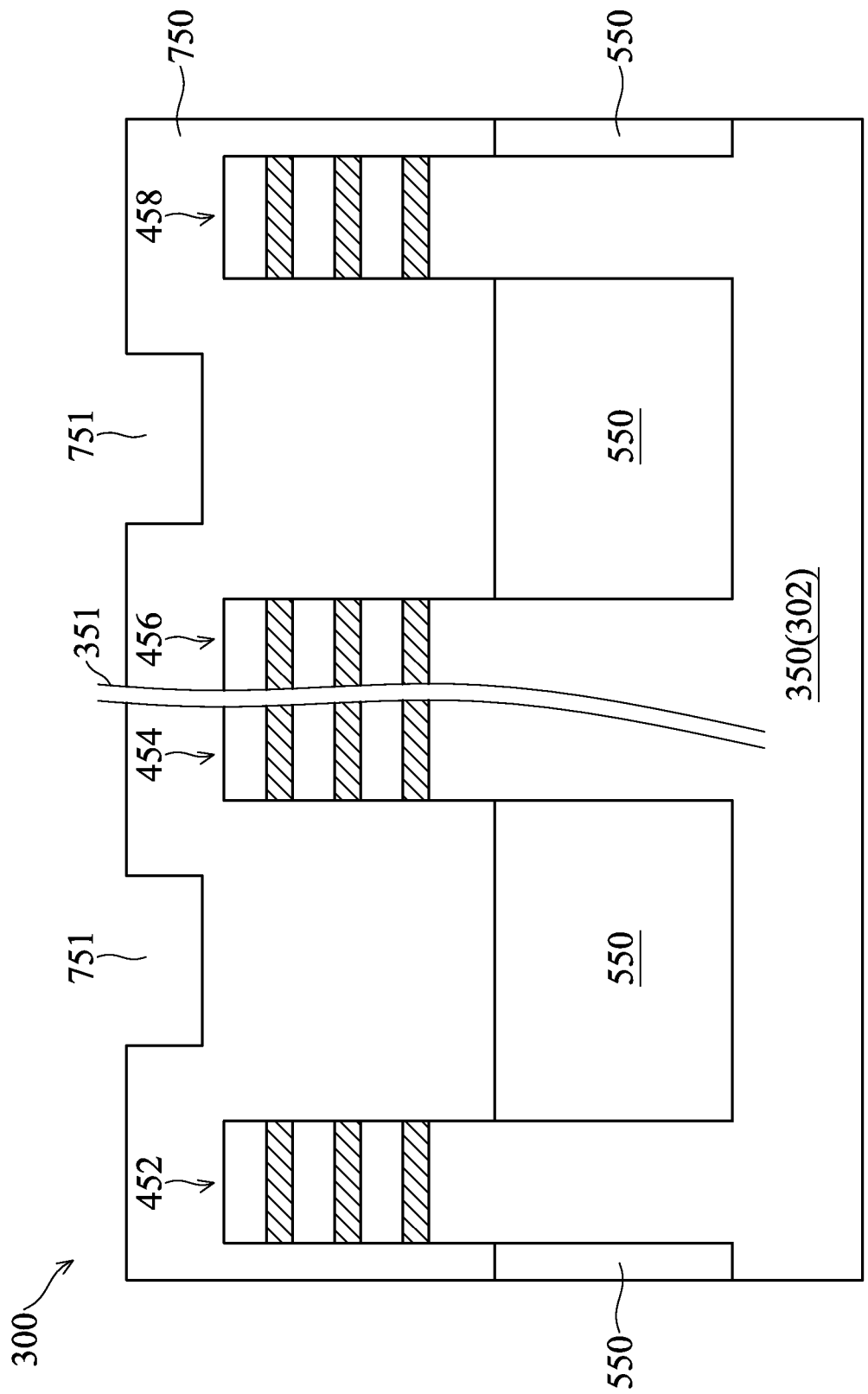

Referring first to FIGS. 8A-B, upon forming the STIs 510 and 550 between the semiconductor fins 412-418 and 452-458, respectively, a layer of the dummy gate structures 710 and 750 may be formed in the areas 310 and 350, respectively. In some embodiments, each of the trenches between the adjacent semiconductor fins can be partially filled by the first layer of dummy gate structure. For example in FIGS. 8A-B, a number of initial recesses 711 may be (e.g., spontaneously or self-aligned) formed in the layer of dummy gate structure 710 between the adjacent semiconductor fins 412 and 414 and between the adjacent semiconductor fins 416 and 418, respectively; a number of initial recesses 751 may be (e.g., spontaneously or self-aligned) formed in the layer of dummy gate structure 750 between the adjacent semiconductor fins 452 and 454 and between the adjacent semiconductor fins 416 and 418, respectively.

Figure 9A:
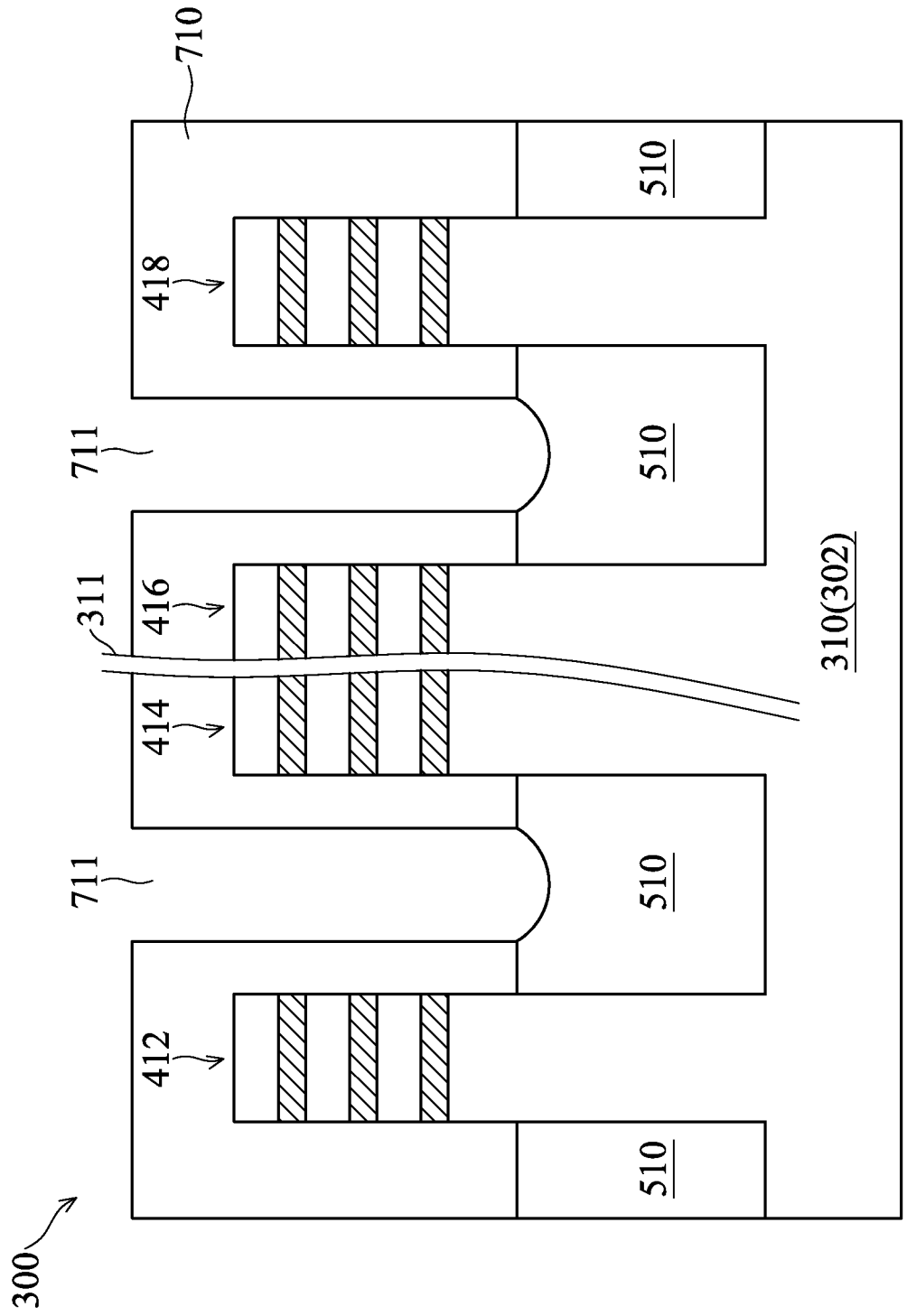
Figure 9B:
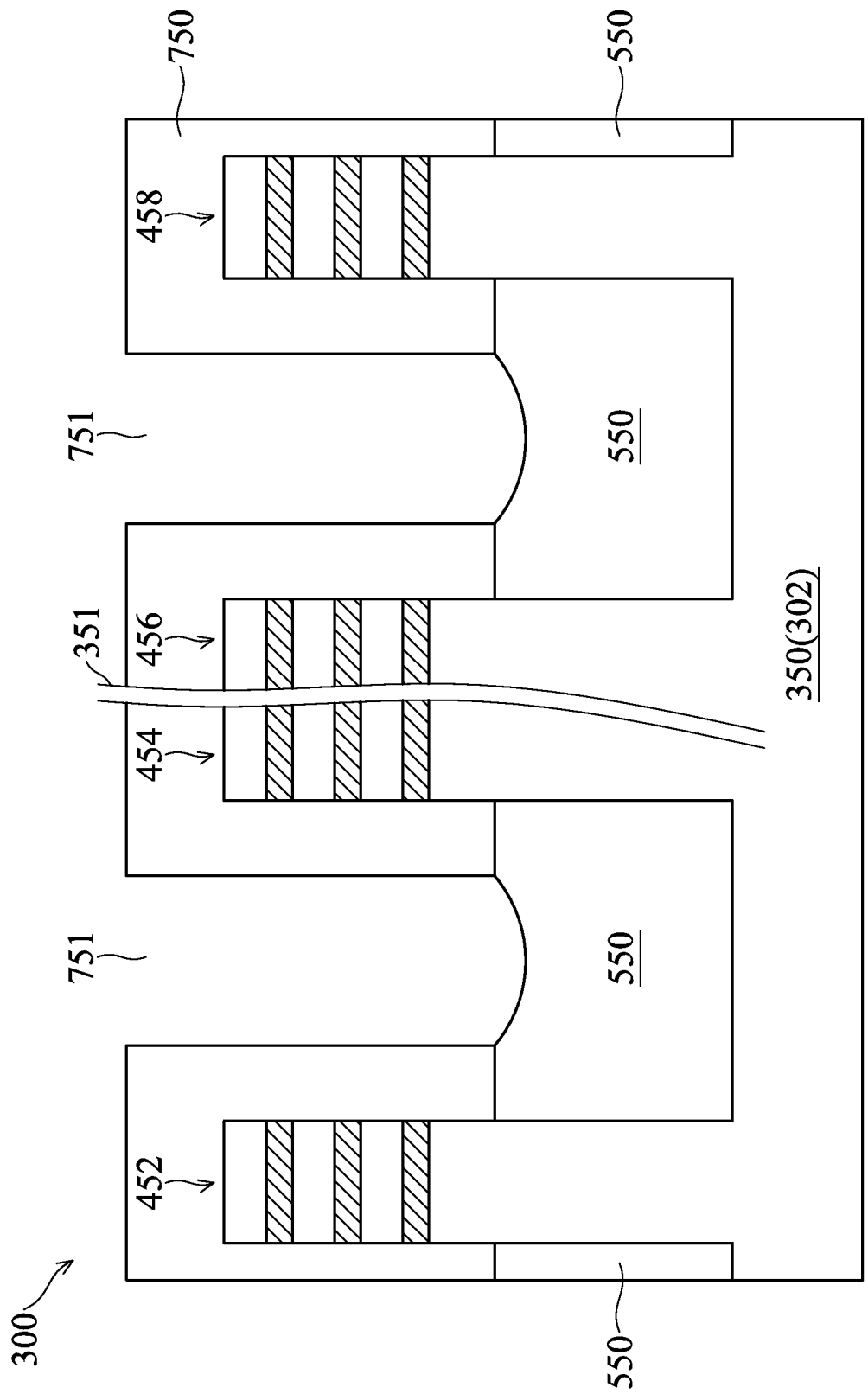

Referring next to FIGS. 9A-B, the initial recesses 711 and 751 may be further extended (toward the substrate 302). To extend the initial recesses 711 and 751, an anisotropic etching process, such as a dry etching process, may be performed. Such an etching process may be performed so as to expose the underlying STIs 510 and 550.

Figure 10A:
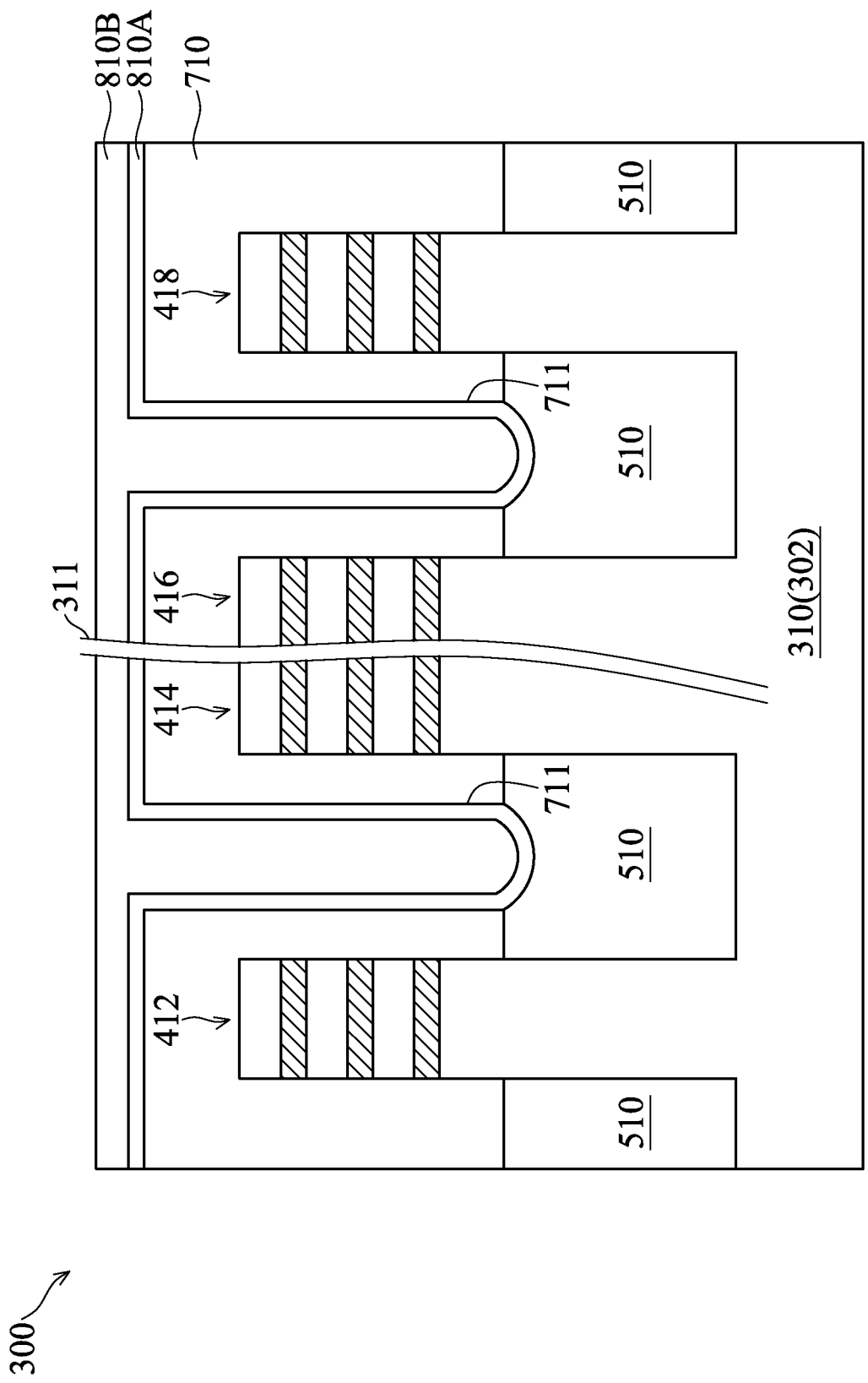
Figure 10B:
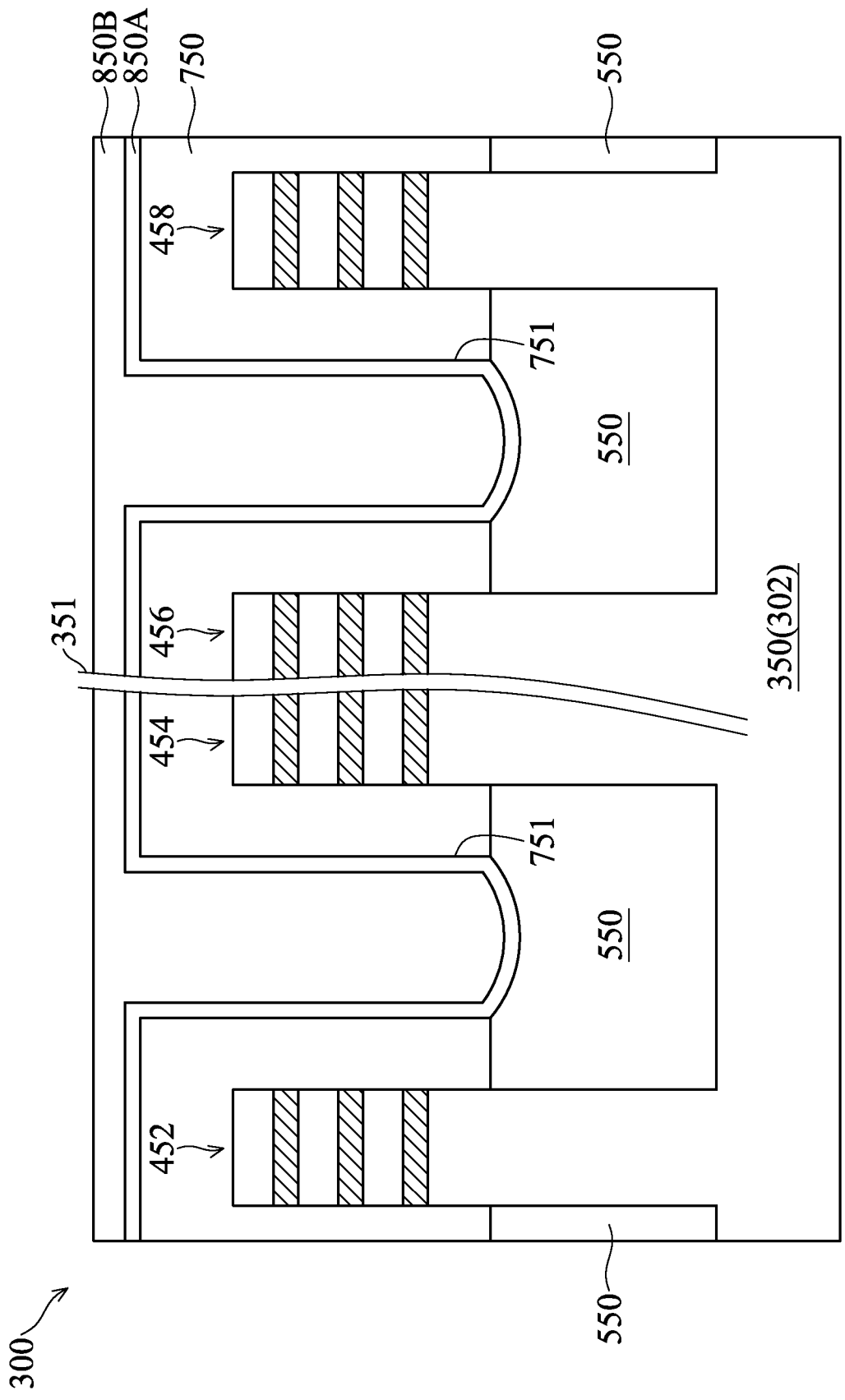

Referring next to FIGS. 10A-B, a number of dummy channel layers can be formed in each of the (extended) recesses 711 and 751. For example, FIG. 10A illustrates that a first dummy channel layer 810A and a second dummy channel layer 810B are formed in the recess 711, where the first dummy channel layer 810A is formed in the recess 711, and the second dummy channel layer 810B is formed on the first dummy channel layer 810A. Both the first dummy channel layer 810A and the second dummy channel layer 810B may be formed in a conformal manner. Specifically, the first dummy channel layer 810A can line the recess 711, with a portion of the recess 711 unfilled. The second dummy channel layer 810B can fill up the recess 711. Similarly, FIG. 10B illustrates that a first dummy channel layer 850A and a second dummy channel layer 850B are formed in the recess 751, where the first dummy channel layer 850A is formed in the recess 751, and the second dummy channel layer 850B is formed on the first dummy channel layer 850A. Both the first dummy channel layer 850A and the second dummy channel layer 850B may be formed in a conformal manner. Specifically, the first dummy channel layer 850A can line the recess 751, with a portion of the recess 751 unfilled. The second dummy channel layer 850B can fill up the recess 751.

Each of the dummy channel layers 810A-B and 850A-B may be formed of a dielectric material. For example, the dielectric material may include silicon oxide, silicon nitride, silicon oxynitride, silicon carbide, silicon carbonitride, silicon oxycarbonitride, silicon oxycarbide, or combinations thereof. In another example, the dielectric material may include an oxide-based or nitride-based material, e.g., aluminum oxide, tantalum nitride, tantalum oxide, hafnium oxide, or combinations thereof. Different stacks of the dummy channel layers (e.g., 810A and 810B, 850A and 850B) may have a same, similar, or different compositions. Further, in each of the recesses 711 and 751, any number of dummy channel layers (e.g., a single dummy channel layer, three dummy channel layers) can be formed.

Next, the dummy channel layers 810A-810B may be recessed through an etching back process so as to leave the dummy channel layers in the recess 711 with a top surface below a top surface of the layer of dummy gate structure 710; and the dummy channel layers 850A-850B may be recessed through an etching back process so as to leave the dummy channel layers in the recess 751 with a top surface below a top surface of the layer of dummy gate structure 750. The etching back process may be anisotropic or isotropic, for example.

Figure 11A:
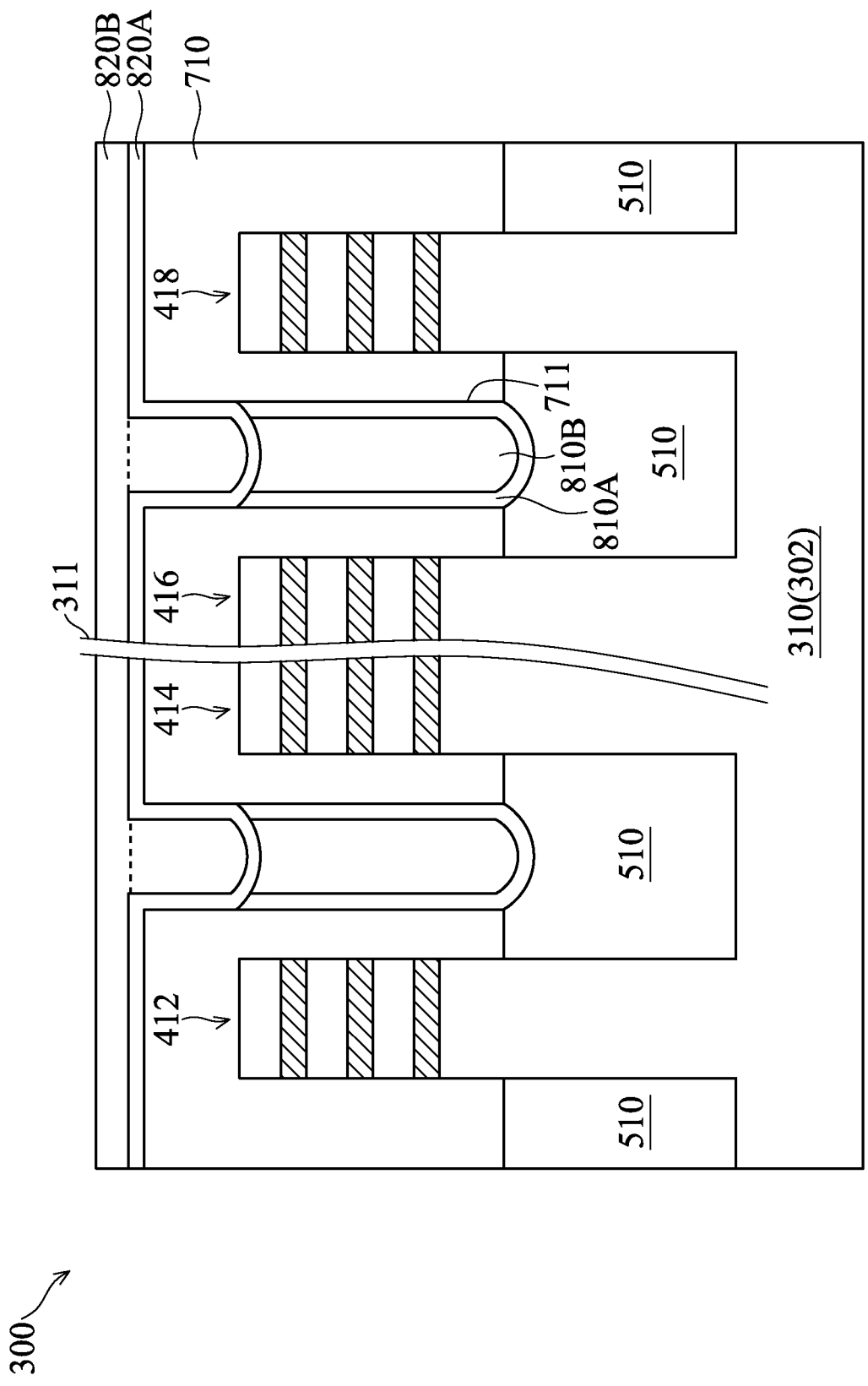
Figure 11B:
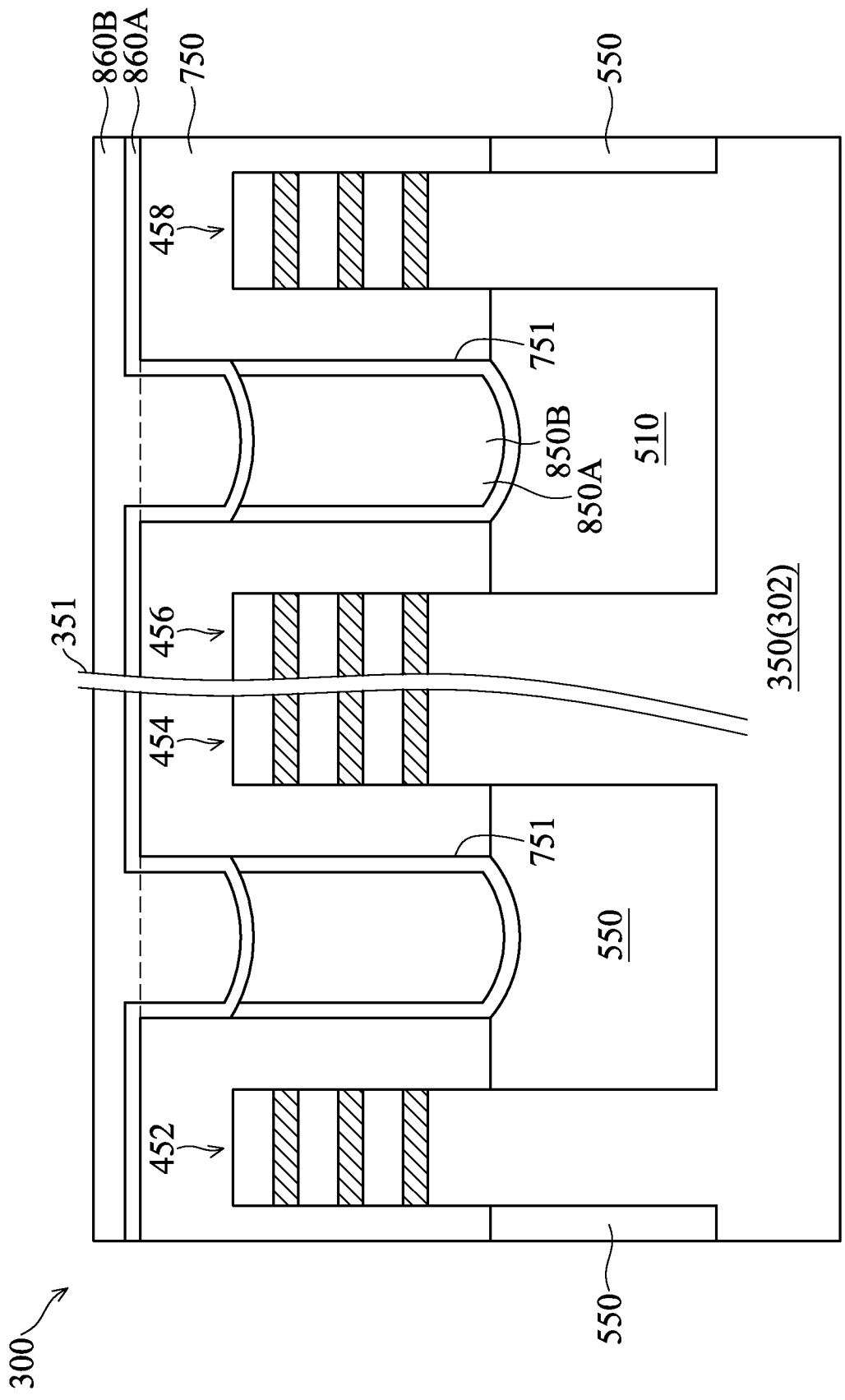

Referring then to FIGS. 11A-B, a number of dummy channel layers can be formed in an upper region of each of the recesses 711 and 751. For example, FIG. 11A illustrates that a third dummy channel layer 820A and a fourth dummy channel layer 820B are formed in the upper region of recess 711, where the third dummy channel layer 820A is formed in the upper region of recess 711 (and over the first and second dummy channel layers 810A and 810B), and the fourth dummy channel layer 820B is formed on the third dummy channel layer 820A. Both the third dummy channel layer 820A and the fourth dummy channel layer 820B may be formed in a conformal manner. Similarly, FIG. 11B illustrates that a third dummy channel layer 860A and a fourth dummy channel layer 860B are formed in the upper region of recess 751, where the third dummy channel layer 860A is formed in the upper region of recess 751 (and over the first and second dummy channel layers 850A and 850B), and the fourth dummy channel layer 860B is formed on the third dummy channel layer 860A. Both the third dummy channel layer 860A and the fourth dummy channel layer 860B may be formed in a conformal manner.

Each of the dummy channel layers 820A-B and 860A-B may be formed of a dielectric material. For example, the dielectric material may include silicon oxide, silicon nitride, silicon oxynitride, silicon carbide, silicon carbonitride, silicon oxycarbonitride, silicon oxycarbide, or combinations thereof. In another example, the dielectric material may include an oxide-based or nitride-based material, e.g., aluminum oxide, tantalum nitride, tantalum oxide, hafnium oxide, or combinations thereof. Different stacks of the dummy channel layers (e.g., 820A and 820B, 860A and 860B) may have a same, similar, or different compositions. Further, in each of the upper region of recesses 711 and 751, any number of dummy channel layers (e.g., a single dummy channel layer, three dummy channel layers) can be formed.

Next, a planarization process, e.g., a chemical mechanical polish (CMP) process, may be performed to level a top surface shared by the layer of dummy gate structures, the third dummy channel layer, and the fourth dummy channel layer. Such a level top surface can be formed in each of the areas 310 and 350, as indicated by the dotted lines in FIGS. 11A and 11B, respectively. Accordingly, a dummy fin including a lower portion and an upper portion can be formed between the adjacent semiconductor fins. Further, the layer of dummy gate structure can be spontaneously separated (by the dummy fin) to overlay respective different semiconductor fins.

Figure 12A:
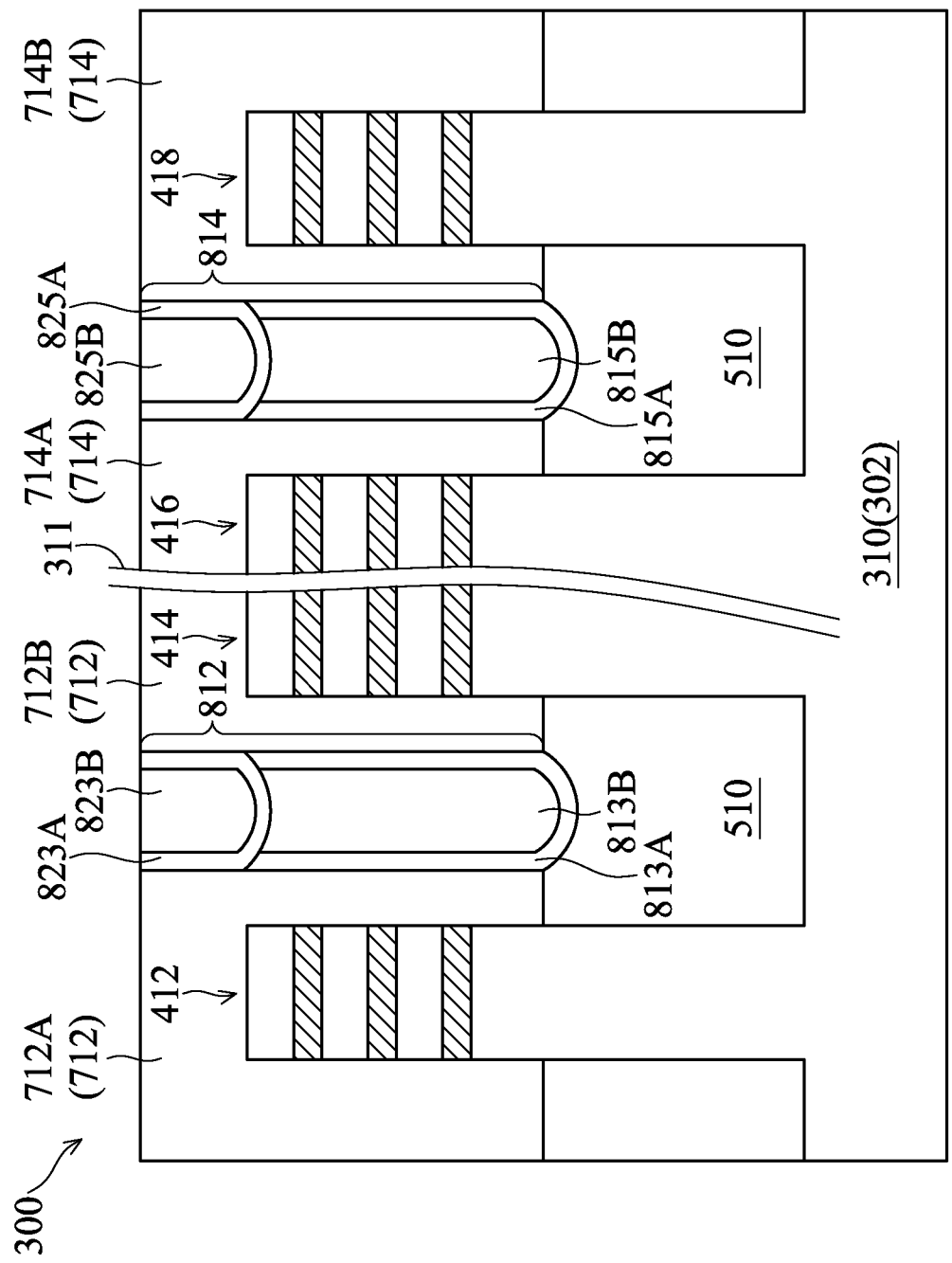
Figure 12B:
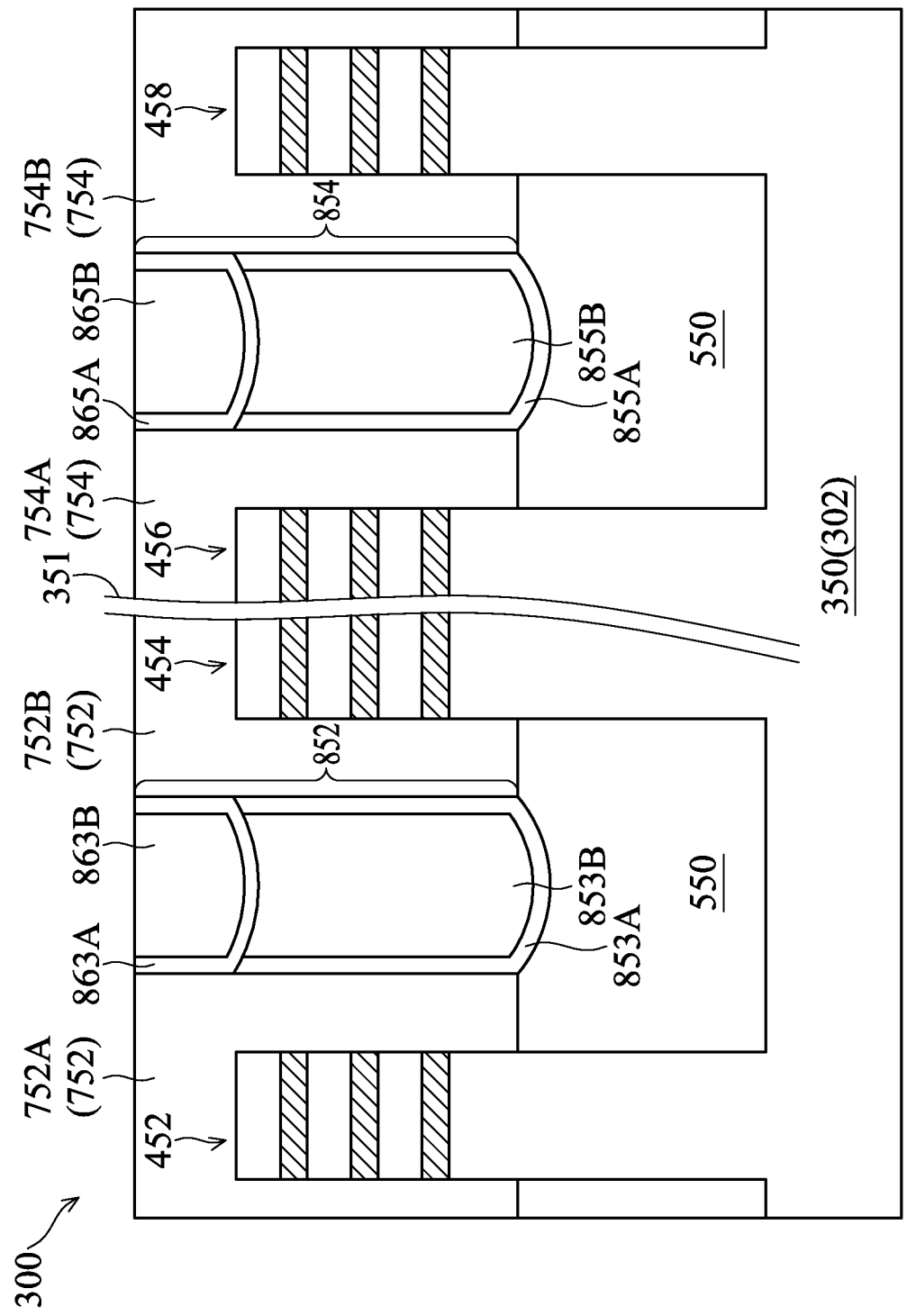

As shown in FIGS. 12A-B, a dummy fin 812 is formed between the semiconductor fins 412 and 414; a dummy fin 814 is formed between the semiconductor fins 416 and 418; a dummy fin 852 is formed between the semiconductor fins 452 and 454; and a dummy fin 854 is formed between the semiconductor fins 456 and 458.

Further, a stack of dummy channel layers 813A (a portion of 810A) and 813B (a portion of 810B) can be formed as a first (e.g., lower) portion of the dummy fin 812 between the semiconductor fins 412 and 414; a stack of dummy channel layers 815A (a portion of 810A) and 815B (a portion of 810B) can be formed as a first (e.g., lower) portion of the dummy fin 814 between the semiconductor fins 416 and 418; a stack of dummy channel layers 853A (a portion of 850A) and 853B (a portion of 850B) can be formed as a first (e.g., lower) portion of the dummy fin 852 between the semiconductor fins 452 and 454; and a stack of dummy channel layers 855A (a portion of 850A) and 855B (a portion of 850B) can be formed as a first (e.g., lower) portion of the dummy fin 854 between the semiconductor fins 456 and 458.

Still further, a stack of dummy channel layers 823A (a portion of 820A) and 823B (a portion of 820B) can be formed as a second (e.g., upper) portion of the dummy fin 812; a stack of dummy channel layers 825A (a portion of 820A) and 825B (a portion of 820B) can be formed as a second (e.g., upper) portion of the dummy fin 814; a stack of dummy channel layers 863A (a portion of 860A) and 863B (a portion of 860B) can be formed as a second (e.g., upper) portion of the dummy fin 852; and a stack of dummy channel layers 865A (a portion of 860A) and 865B (a portion of 860B) can be formed as a second (e.g., upper) portion of the dummy fin 854.

Upon forming the respective upper portions, the dummy fins 812, 814, 852, and 854 can each separate a corresponding dummy gate structure into different dummy gate portions. For example, the dummy fin 812 can separate the dummy gate structure 712 (which is formed by the layer of dummy gate structure 710 of FIGS. 8A-11B) into dummy gate portions 712A and 712B; the dummy fin 814 can separate the dummy gate structure 714 (which is formed by the layer of dummy gate structure 710 of FIGS. 8A-11B) into dummy gate portions 714A and 714B; the dummy fin 852 can separate the dummy gate structure 752 (which is formed by the layer of dummy gate structure 750 of FIGS. 8A-11B) into dummy gate portions 752A and 752B; and the dummy fin 854 can separate the dummy gate structure 754 (which is formed by the layer of dummy gate structure 750 of FIGS. 8A-11B) into dummy gate portions 754A and 754B, as shown in FIGS. 12A-B. Such a second (upper) portion of the dummy fin can be sometimes referred to as a gate isolation structure.

In some other embodiments, upon forming the respective lower portions of the dummy fins 812, 814, 852, and 854 as either a single layer or a multi-layer stack (e.g., FIGS. 10A-B after being planarized), a second layer of the dummy gate structures 712-714 and 752-754 can be formed over the workpiece that has a coplanar surface shared by the respective lower portions of the dummy fins. In this fabrication stage, the semiconductor fins 412 and 414 may share the dummy gate structure 712, through the second layer; the semiconductor fins 416 and 418 may share the dummy gate structure 714, through the second layer; the semiconductor fins 452 and 454 may share the dummy gate structure 752, through the second layer; and the semiconductor fins 456 and 458 may share the dummy gate structure 754, through the second layer.

Next, a second (e.g., upper) portion of each of the dummy fins 812, 814, 852, and 854 can be formed by replacing portions of the second layer of the dummy gate structures with one or more dummy channel layers. For example in FIGS. 12A-B, a stack of dummy channel layers 823A and 823B can be formed as a second (e.g., upper) portion of the dummy fin 812; a stack of dummy channel layers 825A and 825B can be formed as a second (e.g., upper) portion of the dummy fin 814; a stack of dummy channel layers 863A and 863B can be formed as a second (e.g., upper) portion of the dummy fin 852; and a stack of dummy channel layers 865A and 865B can be formed as a second (e.g., upper) portion of the dummy fin 854. Although in the illustrated embodiments of FIGS. 12A-B, an interface between the first and second portions of each dummy fin has a curvature-based profile, it should be understood that the interface may have any of various other profiles while remaining within the scope of the present disclosure. For example, the interface may have an edge-based profile, which may include one or more edges between the first and second portions.

Upon forming the dummy gate structures 712-714 and 752-754, either after or before forming the dummy fins, a gate spacer (e.g., as shown in the perspective view of FIG. 1) may be formed on opposing sidewalls of each of the dummy gate structures 712-714 and 752-754. Such sidewalls can face along or away from the lengthwise direction of the semiconductor/dummy fins. Thus, the gate spacer can be disposed between each of the exposed portions of the fins and the dummy gate structure. The gate spacer may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer.

Next, portions of each of the semiconductor fins 412-414, 416-418, 452-454, and 456-458 that are not overlaid by the dummy gate structure are replaced with source/drain structures (e.g., as shown in the perspective view of FIG. 1). To form the source/drain structures, the dummy gate structure (together with the corresponding gate spacer) can serve as a mask to recess (e.g., etch) the non-overlaid portions of each of the semiconductor fins 412-414, 416-418, 452-454, and 456-458, which results in recesses formed on opposite sides of each of the remaining semiconductor fins. The source/drain structures are formed by epitaxially growing a semiconductor material in the recesses, using suitable methods such as metal-organic CVD (MOCVD), molecular beam epitaxy (MBE), liquid phase epitaxy (LPE), vapor phase epitaxy (VPE), selective epitaxial growth (SEG), the like, or combinations thereof.

Prior to forming the source/drain structures, end portions of the semiconductor layers 401 (FIGS. 4A-B) of each semiconductor fin can be removed (e.g., etched) using a "pull-back" process to pull the semiconductor layers 401 back by a pull-back distance. In an example where the semiconductor layers 402 include Si, and the semiconductor layers 401 include SiGe, the pull-back process may include a hydrogen chloride (HCl) gas isotropic etch process, which etches SiGe without attacking Si. As such, the Si layers (nanostructures) 402 may remain intact during this process. Consequently, a pair of recesses can be formed on the ends of each semiconductor layer 401, with respect to the neighboring semiconductor layers 402. Next, such recesses along the ends of each semiconductor layer 401 can be filled with a dielectric material to form inner spacers. The dielectric material for the inner spacers may include silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacers of transistors.

Following the formation of source/drain structures, an interlayer dielectric (ILD) is formed over the source/drain structures. The ILD is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD.

According to various embodiments of the present disclosure, the semiconductor layers 402 in one or more of the semiconductor fins may collectively function as the (conductive) channel of a completed transistor. Accordingly, the semiconductor layers 402 may hereinafter be referred to as channel layers. The (remaining) semiconductor layers 401 in each of the semiconductor fins may be later replaced with a portion of an active gate structure that is configured to wrap around the corresponding channel layers. Accordingly, the semiconductor layers 401 may hereinafter be referred to as sacrificial layers.

Figure 13A:
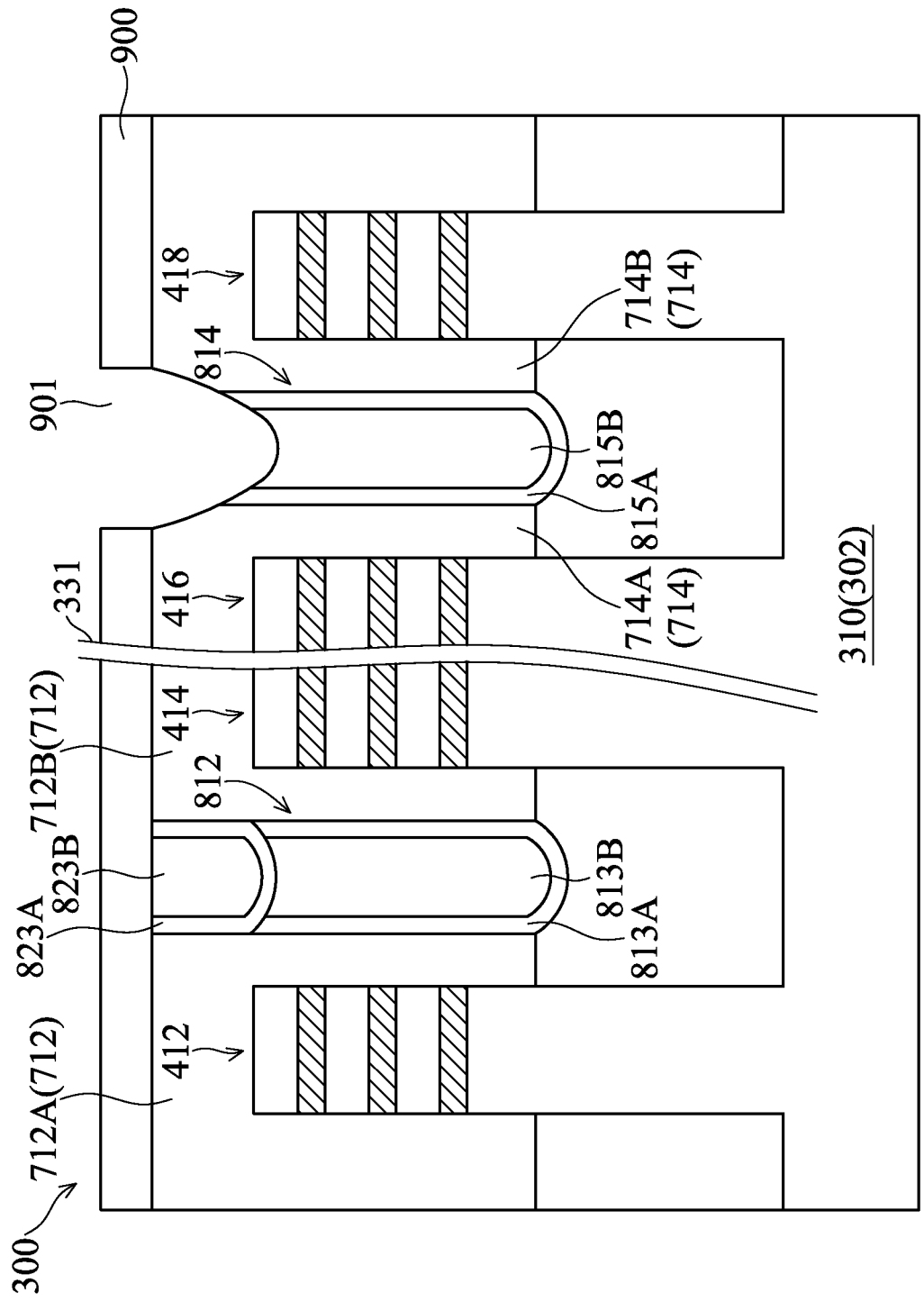
Figure 13B:
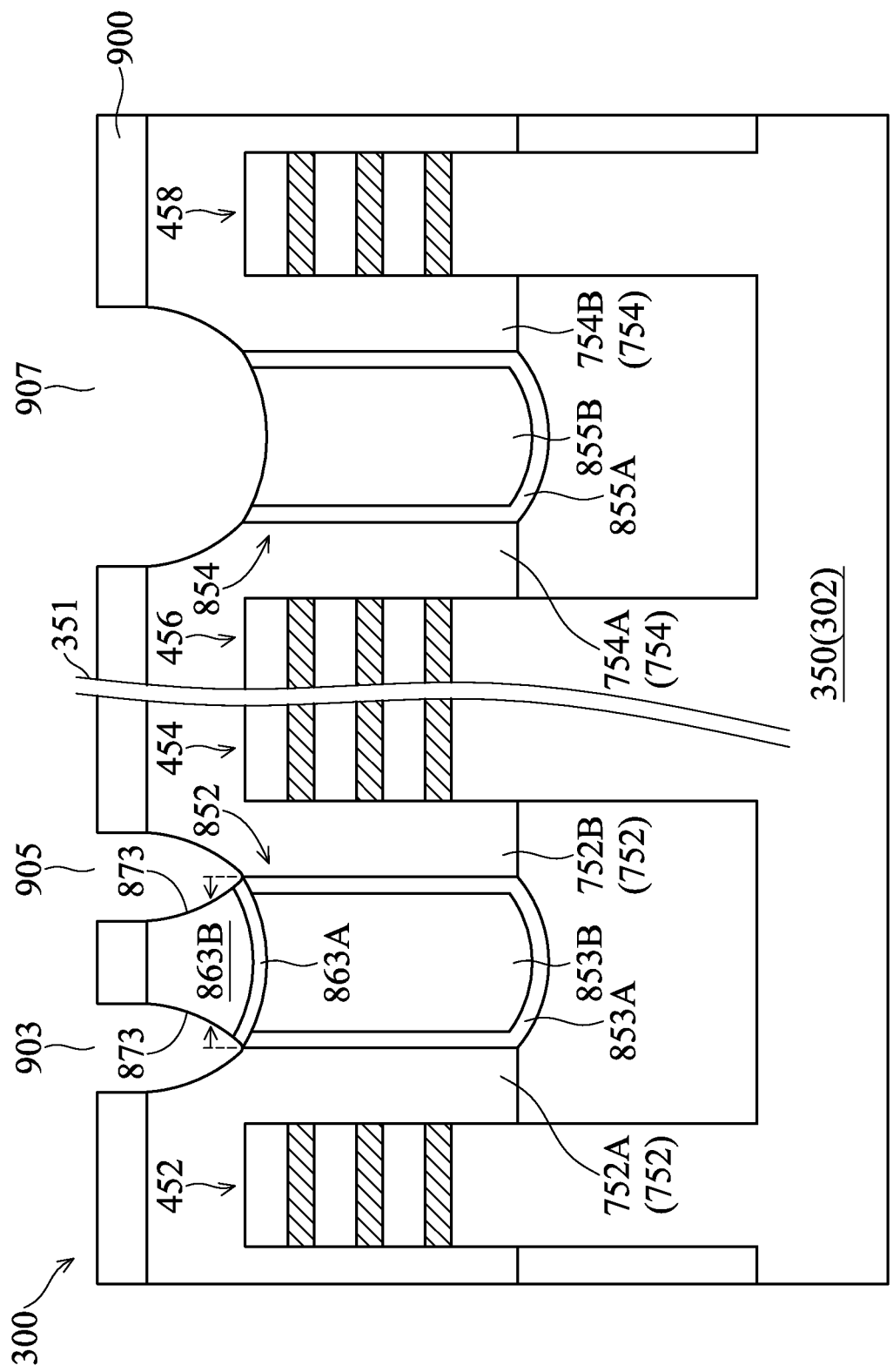

Corresponding to operation 212 of FIG. 2, FIG. 13A is a cross-sectional view of the nanosheet FET device 300 in which a profile of the dummy fin 814 is changed in the area 310, and FIG. 13B is a cross-sectional view of the nanosheet FET device 300 in which respective profiles of the dummy fins 852 and 854 are changes in the area 350, at one of the various stages of fabrication. The cross-sectional views of FIGS. 13A-B are each cut in a direction along the lengthwise direction of an active/dummy gate structure of the nanosheet FET device 300 (e.g., cross-section A-A indicated in FIG. 1).

It is noted that the following discussion regarding reshaping of the dummy fins are based on the illustrated examples of FIGS. 12A-B, where the dummy fins are formed after forming the dummy gate structures and each of the dummy fins includes a lower portion and an upper portion, each of which can further include one or more dummy channel layers. However, it should be understood that the following discussion can also be applied in reshaping a dummy fin formed before forming a dummy gate structure and formed as a continuous one-piece structure (e.g., the dummy fins 612-654 of FIGS. 7A-B), while remaining within the scope of the present disclosure.

In some embodiments, a mask layer 900 having a number of openings can be formed over the workpiece to expose a number of portions, respectively. For example in FIGS. 13A-B, the mask layer 900 has openings 901, 903, 905, and 907 to expose respective portions of the workpiece, with other portions covered. The opening 901 can expose at least the dummy fin 814 in the area 310; the openings 903 and 905 can expose at least a number of portions of the dummy fin 852 in the area 350; and the opening 907 can expose at least the dummy fin 854 in the area 350. Next, at least one etching process can be performed to reshape the dummy fins 814, 852, and 854. As shown in the example of FIGS. 13A-B, the dummy fin 812 remains substantially intact; the dummy fin 814 is reshaped to remove its upper portion; the dummy fin 852 is reshaped to remove its upper sidewall portions; and the dummy fin 854 is reshaped to remove its upper portion. In other words, a distance between sidewalls of the dummy fin 812 may remain substantially constant, while a distance between at least upper portions of sidewalls of the dummy fin 852 may decrease, with an increasing height of the dummy fin 852.

Specifically, in the high density area 310 where the different portions of a dummy gate structure (e.g., 714A and 714B) are configured not to be completely separated from each other, at least the upper portion of the dummy fin 814 (e.g., 825A and 825B shown in FIG. 12A) can be removed. In the low density area 350 where the different portions of a dummy gate structure (e.g., 752A and 752B) are configured to be completely separated from each other, at least the upper sidewall portions of the dummy fin 852 (e.g., the upper sidewall portion of 863B shown in FIG. 13) can be removed. In the low density area 350 where the different portions of a dummy gate structure (e.g., 754A and 754B) are configured not to be completely separated from each other, at least the upper portion of the dummy fin 854 (e.g., 865A and 865B shown in FIG. 12B) can be removed.

With the upper sidewall portions of the dummy fin 852 removed, sidewalls 873 of at least the upper portion of the dummy fin 852 can be separated with a decreasing distance, with an increasing height of the dummy fin 852, as shown in FIG. 13B. Alternatively stated, the sidewalls 873 can tilt to each other, with the increasing height of the dummy fin 852. By reshaping the dummy fin 852 in such a tapered profile, a process window to form active gate structures can be advantageously increased. For example, the dummy gate portions 752A and 752B will be later removed to form gate trenches over the semiconductor fins 452 and 454, respectively, which will be filled with respective active gate structures. By removing the upper sidewall portions of the dummy fin 852, the gate trenches can be laterally enlarged, as indicated by the arrows in FIG. 13B, which forms a larger window to fill the active gate structures. In some embodiments, such an increase of the gate trench in the area 350 can be characterized by a critical dimension that is between about 0.5 nanometers (nm) and 1000 nm.

Figure 14A:
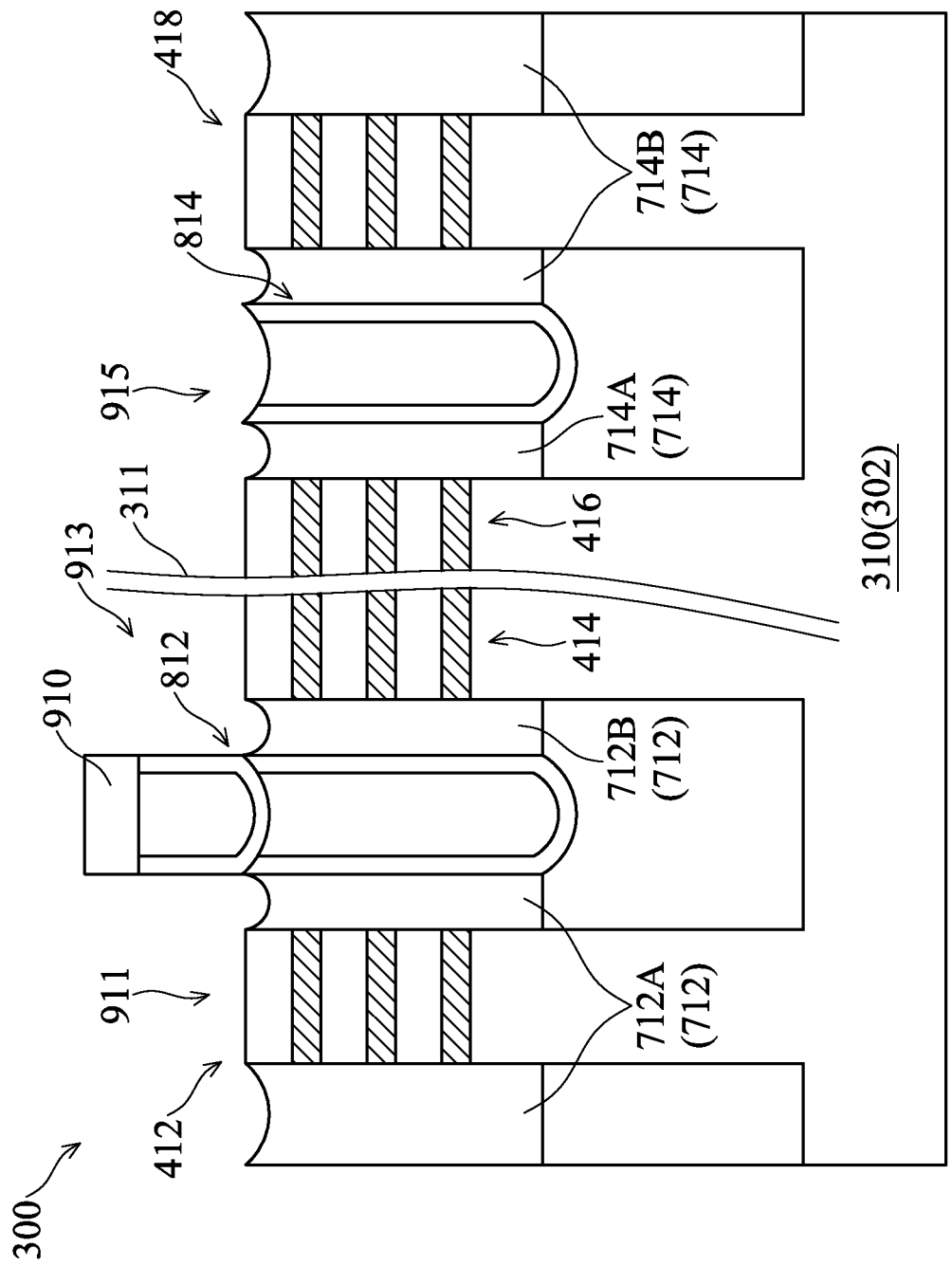
Figure 14B:
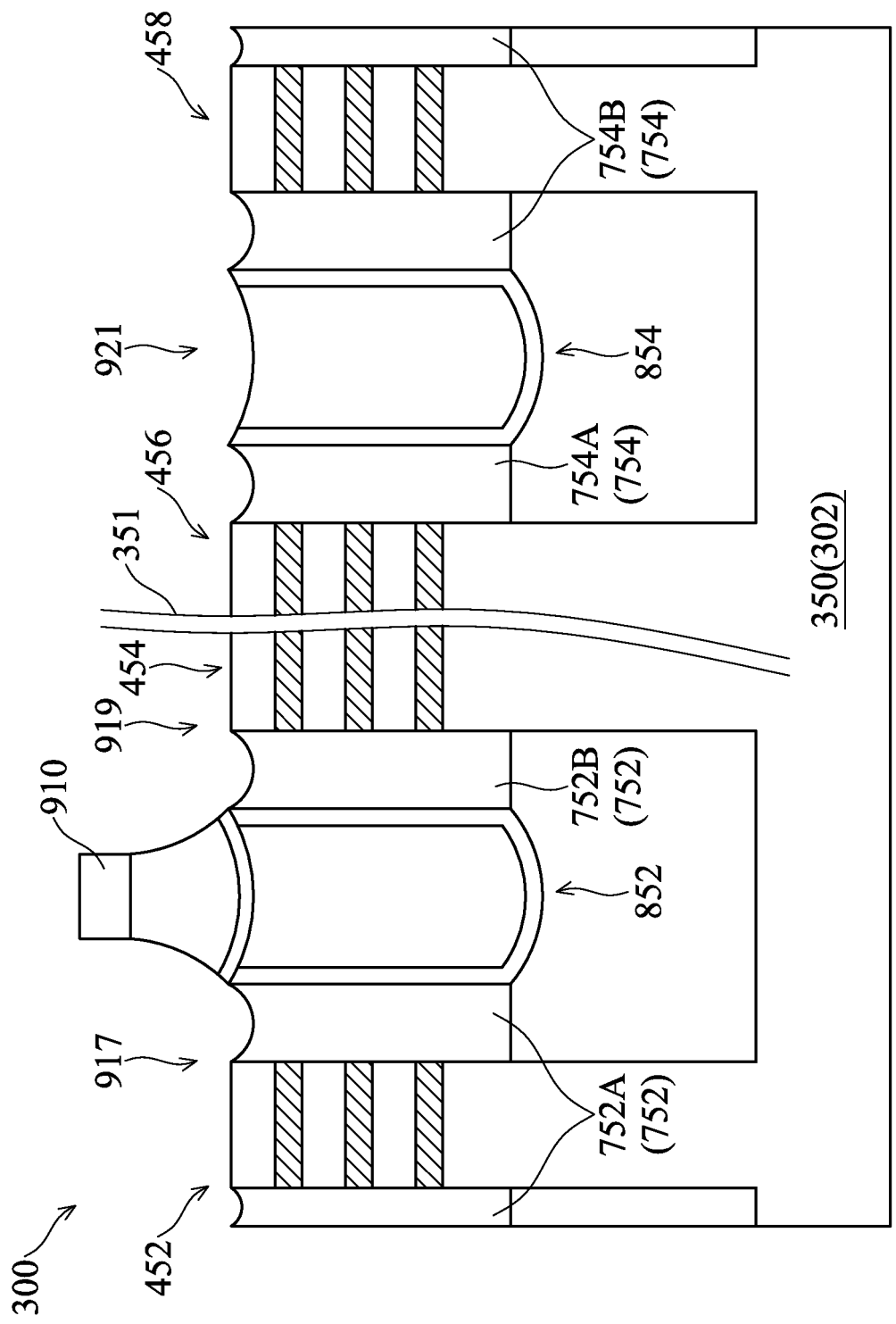

Also corresponding to operation 212 of FIG. 2, FIG. 14A is a cross-sectional view of the nanosheet FET device 300 in which the profile of the dummy fin 814 is changed in the area 310, and FIG. 14B is a cross-sectional view of the nanosheet FET device 300 in which the respective profiles of the dummy fins 852 and 854 are changes in the area 350, at one of the various stages of fabrication. The cross-sectional views of FIGS. 14A-B are each cut in a direction along the lengthwise direction of an active/dummy gate structure of the nanosheet FET device 300 (e.g., cross-section A-A indicated in FIG. 1). The changed profiles of the dummy fins 814, 852, and 854 shown in FIGS. 14A-B are substantially similar as those shown in FIGS. 13A-B, and thus, some of the description are not repeated.

Figure 14C:
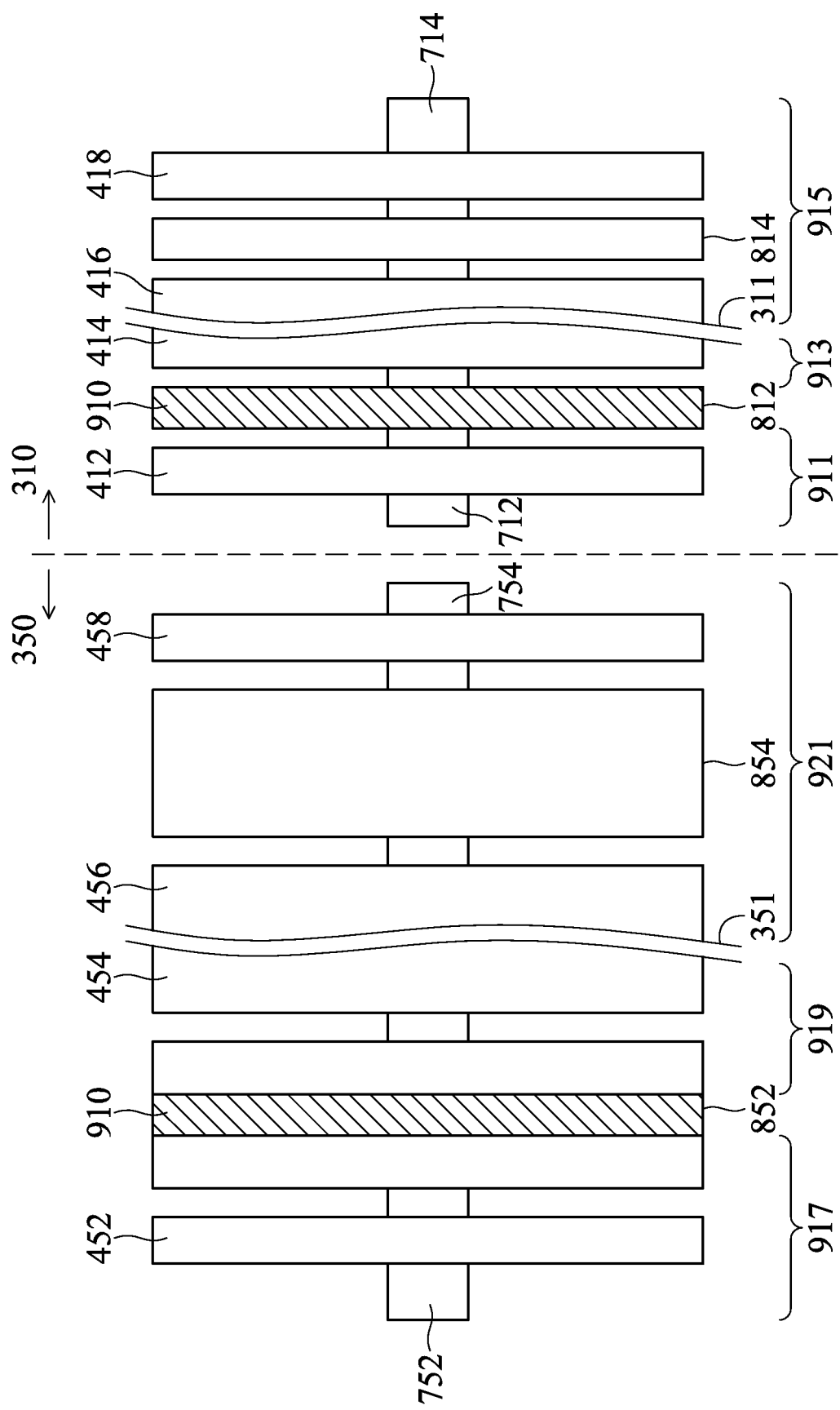

In some embodiments, a mask layer 910 having a number of openings can be formed over the workpiece to expose a number of portions, respectively. For example in FIGS. 14A-B, the mask layer 910 has openings 911, 913, 915, 917, 919, and 921 to expose respective portions of the workpiece, with other portions covered, which can be better seen in a top view of the nanosheet FET device 300 (FIG. 14C). The opening 911 can expose the dummy gate portion 712A in the area 310; the opening 913 can expose the dummy gate portion 712B in the area 310; the opening 915 can expose the dummy gate portions 714A-B and the dummy fin 814 in the area 310; the opening 917 can expose the dummy gate portions 752A (and a portion of the dummy fin 852) in the area 350; the opening 919 can expose the dummy gate portions 752B (and a portion of the dummy fin 852) in area 350; and the opening 921 can expose the dummy gate portions 754A-B and the dummy fin 854 in the area 350. Next, at least one etching process can be performed to reshape the dummy fins 814, 852, and 854, while removing respective upper portions of the dummy gate structures 712, 714, 752, and 754. As shown in the example of FIGS. 14A-B, the dummy fin 812 may remain substantially intact; the dummy fin 814 is reshaped to remove its upper portion; the dummy fin 852 is reshaped to remove its upper sidewall portions; and the dummy fin 854 is reshaped to remove the upper portion. In other words, a distance between sidewalls of the dummy fin 812 may remain substantially constant, while a distance between at least upper portions of sidewalls of the dummy fin 852 may decrease, with an increasing height of the dummy fin 852.

The etching process to reshape the profiles of the dummy fins 814, 852, and 854 may be configured to have at least some anisotropic etching characteristic to limit an undesired lateral etching amount. For example, the etching process can include a plasma etching process, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof to reach the above-described etching characteristic.

As a non-limiting example, a source power of 10 watts to 3000 watts, a bias power of 0 watts to 3000 watts, a pressure of 1 millitorr to 5 torr, and an etch gas flow of 0 standard cubic centimeters per minute to 5000 standard cubic centimeters per minute may be used in the etching process.

However, it is noted that source powers, bias powers, pressures, and flow rates outside of these ranges are also contemplated.

In some embodiments, the above-described etching conditions may change in accordance with a material of the dummy fins. For example, when the dummy fin includes aluminum oxide and/or hafnium oxide, the etchant gas may include chlorine ($Cl_2$) and/or boron trichloride ($BCl_3$), diluted with gases such as argon (Ar). In another example, when the dummy fin includes a silicon-based material (e.g., $Si_3N_4$, SiOCN), the etchant gas may include fluoroform ($CHF_3$), difluoromethane ($CH_2F_2$), fluoromethane ($CH_3F$), with passivation gases such as oxygen ($O_2$) and diluted with gases such as argon (Ar).

FIGS. 15A, 15B, 15C, 15D, 15E, 15F, 15G, 15H, 15I, 15J, and 15K illustrate enlarged, cross-sectional views of the dummy fins 812 and/or 852 reshaped during operation 212 of FIG. 2, in accordance with various other embodiments. The cross-sectional views of FIGS. 15A-K are each cut in a direction along the lengthwise direction of an active/dummy gate structure of the nanosheet FET device 300 (e.g., cross-section A-A indicated in FIG. 1).

In the illustrated embodiments discussed with respect to FIG. 14A, when reshaping the dummy fin 852 in the area 350 using the mask layer 910, the profile of the dummy fin 812, configured to separate the dummy gate portions 712A and 712B in the area 310, may also be changed. For example in FIG. 15A, sidewalls of the bottommost dummy channel layer 823A may be removed (as indicated by dotted lines), thereby exposing sidewalls of the topmost dummy channel layer 823B. Alternatively stated, the topmost dummy channel layer 823B may remain substantially intact. By removing portions of the sidewalls of the dummy fin 812, gate trenches to form active gate structures (that overlay semiconductor fins 412 and 414, respectively) can be laterally enlarged. In some embodiments, such an increase of the gate trench in the area 310 can be characterized by a critical dimension that is between about 0 nm and 1000 nm.

Figure 15B:
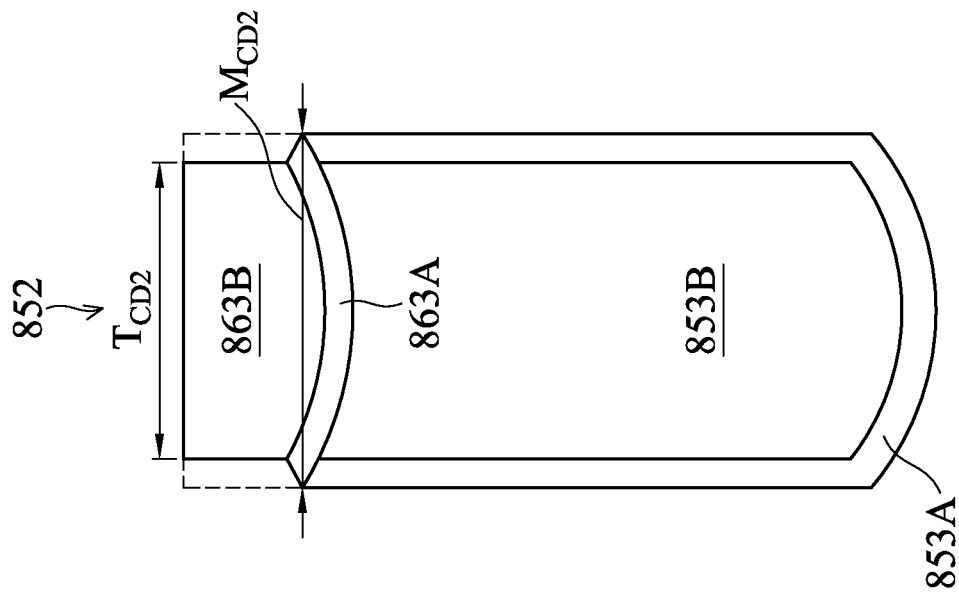
Figure 15A:
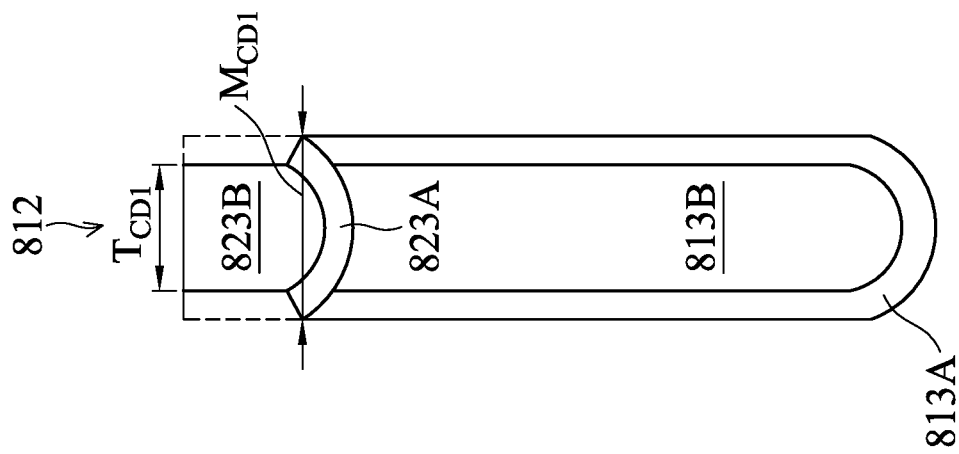
Figure 15C:
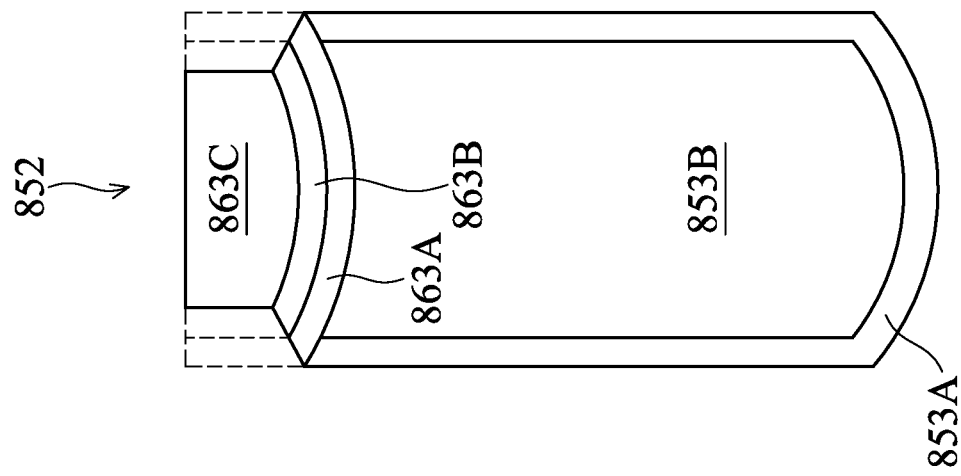
Figure 15D:
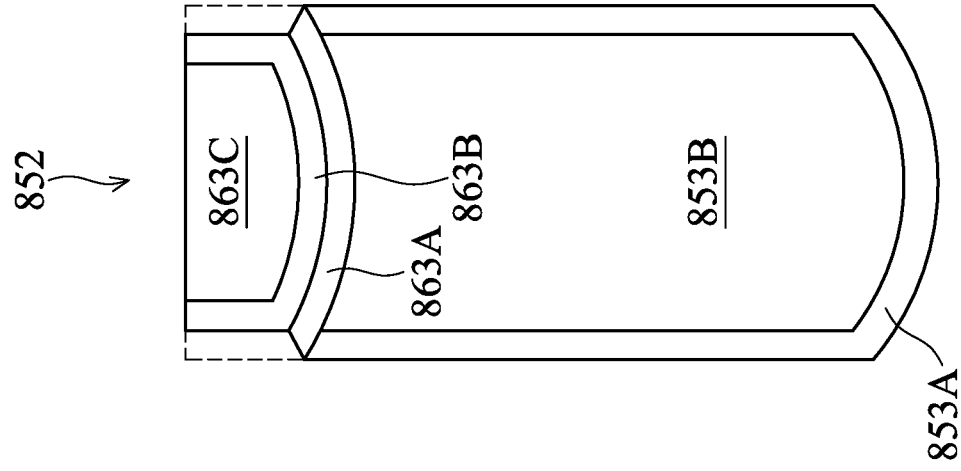
Figure 15F:
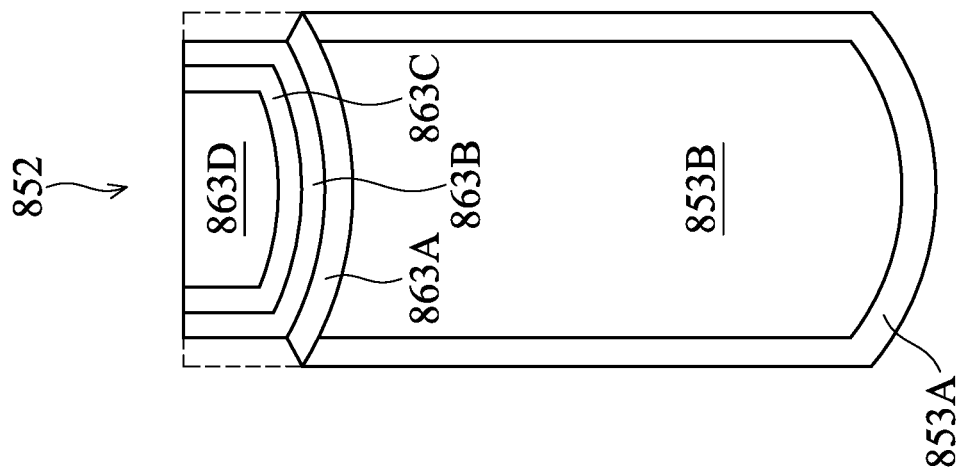
Figure 15E:
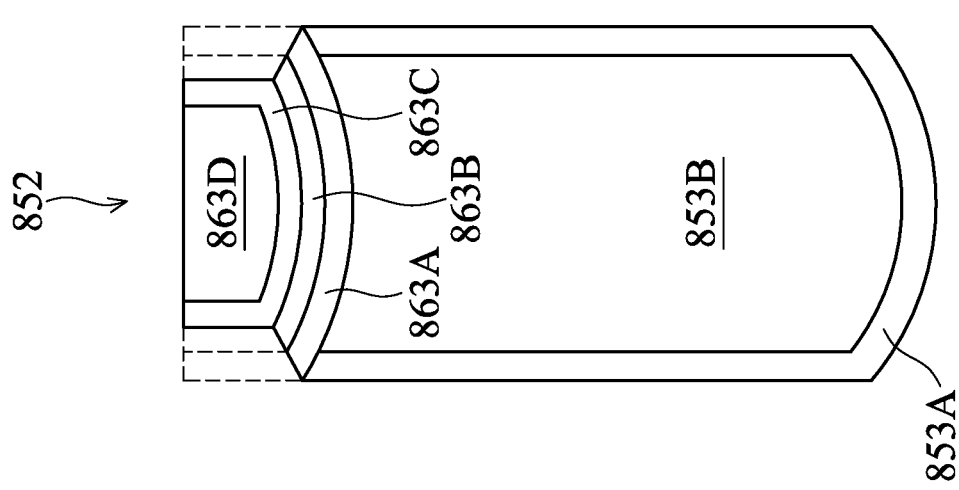
Figure 15K:
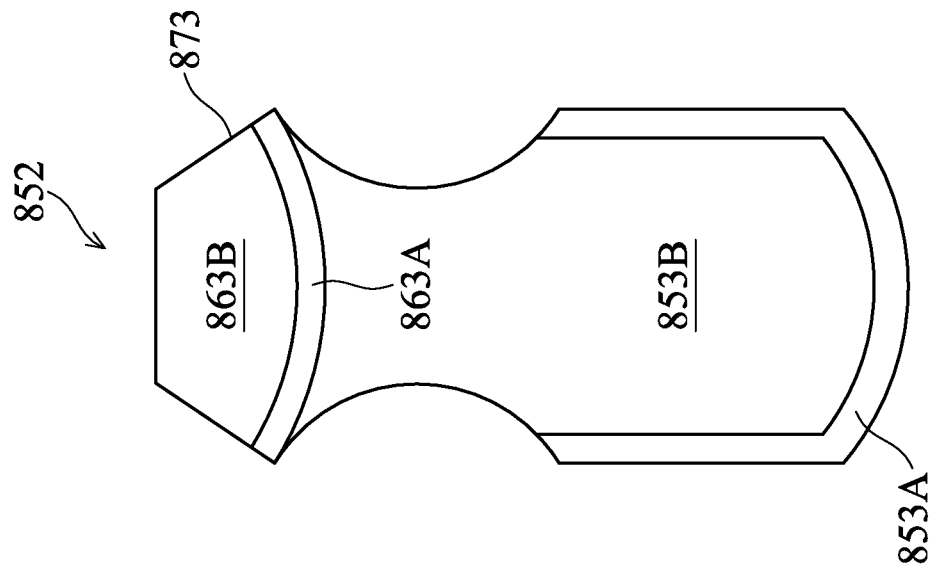
Figure 15J:
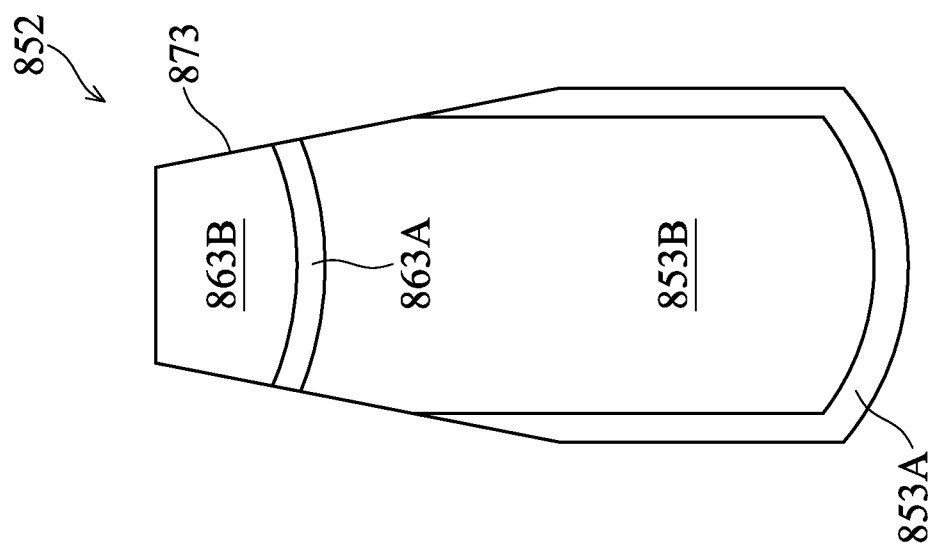

FIGS. 15B-J illustrate various other embodiments of the reshaped dummy fin 852, that can be formed through either the mask layer 900 of FIGS. 13A-B, or the mask layer 910 of FIGS. 14A-B. In particular, FIG. 15B illustrates the upper portion of the dummy fin 852 having a stack of two dummy channel layers (e.g., similar as the examples of FIGS. 12A-14B); FIGS. 15C-D illustrate the upper portion of the dummy fin 852 having a stack of three dummy channel layers; FIGS. 15E-F illustrate the upper portion of the dummy fin 852 having a stack of four dummy channel layers; and FIGS. 15G-I illustrate the upper portion of the dummy fin 852 having a stack of five dummy channel layers. It should be understood that at least the upper portion of the dummy fin 852 can include any number of dummy channel layers, while remaining within the scope of the present disclosure. After being reshaped, respective sidewalls of one or more of the dummy channel layers may be removed, which will be discussed in detail below. In addition to reshaping the upper portion of the dummy fin 852, FIGS. 15J-K illustrate the dummy fin 852 with a reshaped lower portion.

Referring first to FIG. 15B, sidewalls of the bottommost dummy channel layer 863A may be removed (as indicated by dotted lines), thereby exposing sidewalls of the topmost dummy channel layer 863B. Alternatively stated, the topmost dummy channel layer 863B may remain substantially intact. In some other embodiments, sidewall portions of the topmost dummy channel layer 863B may also be consumed (e.g., removed) by the etching process. Although the reshaped dummy fin 852 does not present a tapered profile, the removed sidewalls of at least one of the dummy channel layers can still enlarge the process window to refill a gate trench with an active gate structure.

Referring then to FIGS. 15C-D, the upper portion of the dummy fin 852 includes three dummy channel layers 863A, 863B, and 863C stacked on top of one another. In FIG. 15C, sidewalls of the bottommost dummy channel layer 863A may be removed (as indicated by dotted lines), thereby exposing sidewalls of the second bottommost dummy channel layer 863B. In FIG. 15D, sidewalls of the bottommost and second bottommost dummy channel layers 863A and 863B may be removed (as indicated by dotted lines), thereby exposing sidewalls of the topmost dummy channel layer 863C. Although sidewalls of the remaining dummy channel layers (the dummy channel layers 863B and 863C of FIG. 15C, the dummy channel layer 863C of FIG. 15D) remain substantially intact in the illustrated examples, it should be understood that sidewall portions of such remaining dummy channel layers may also be consumed (e.g., removed) during the etching process.

Referring then to FIGS. 15E-F, the upper portion of the dummy fin 852 includes four dummy channel layers 863A, 863B, 863C, and 863D stacked on top of one another. In FIG. 15E, sidewalls of the bottommost dummy channel layer 863A and the second bottommost dummy channel layer 863B may be removed (as indicated by dotted lines), thereby exposing sidewalls of the third bottommost dummy channel layer 863C. In FIG. 15F, sidewalls of the bottommost dummy channel layer 863A may be removed (as indicated by dotted lines), thereby exposing sidewalls of the second bottommost dummy channel layer 863B. Although sidewalls of the remaining dummy channel layers (the dummy channel layers 863C and 863D of FIG. 15E, the dummy channel layers 863B-D of FIG. 15F) remain substantially intact in the illustrated examples, it should be understood that sidewall portions of such remaining dummy channel layers may also be consumed (e.g., removed) during the etching process.

Referring then to FIGS. 15G-I, the upper portion of the dummy fin 852 includes five dummy channel layers 863A, 863B, 863C, 863D, and 863E stacked on top of one another. In FIG. 15G, sidewalls of the bottommost dummy channel layer 863A and the second bottommost dummy channel layer 863B may be removed (as indicated by dotted lines), thereby exposing sidewalls of the third bottommost dummy channel layer 863C. In FIG. 15H, sidewalls of the bottommost dummy channel layer 863A may be removed (as indicated by dotted lines), thereby exposing sidewalls of the second bottommost dummy channel layer 863B. In FIG. 15I, sidewalls of the bottommost dummy channel layer 863A, the second bottommost dummy channel layer 863B, and the third bottommost dummy channel layer 863C may be removed (as indicated by dotted lines), thereby exposing sidewalls of the fourth bottommost dummy channel layer 863D. Although sidewalls of the remaining dummy channel layers (the dummy channel layers 863C-E of FIG. 15G, the dummy channel layers 863B-E of FIG. 15H, the dummy channel layers 863D-E of FIG. 15I) remain substantially intact in the illustrated examples, it should be understood that sidewall portions of such remaining dummy channel layers may also be consumed (e.g., removed) during the etching process.

Referring then to FIGS. 15J-K, in addition to the upper portion (863A-B), the lower portion (853A-B) of the dummy fin 852 may also be reshaped. In FIG. 15J, respective upper sidewall portions of the dummy channel layers 853A and 853B may also be removed, which can extend the tilted sidewall 873 from the upper portion to the lower portion, as illustrated. In FIG. 15K, respective upper sidewall portions of the dummy channel layers 853A and 853B may also be removed, which can render recesses in the lower portion with respect the tilted sidewall 873 in the upper portion, as illustrated.

In some embodiments, a minimum width (along the lengthwise direction of the gate structure) of the upper portion of the dummy fin 812 (in the high density area 310) may be characterized with a critical dimension, $T_{CD1}$, and a minimum width (along the lengthwise direction of the gate structure) of the lower portion of the dummy fin 812 may be characterized with a critical dimension, $M_{CD1}$, as indicated in FIG. 15A. A first ratio of Tax to Max may be between about 20% and about 100%, i.e., $T_{CD1} \leq M_{CD1}$. A minimum width (along the lengthwise direction of the gate structure) of the upper portion of the dummy fin 852 (in the low density area 350) may be characterized with a critical dimension, $T_{CD2}$, and a minimum width (along the lengthwise direction of the gate structure) of the lower portion of the dummy fin 852 may be characterized with a critical dimension, $M_{CD2}$, as indicated in FIG. 15B. A second ratio of $T_{CD2}$ to $M_{CD2}$ may be between about 5% and about 90%, i.e., $T_{CD2} < M_{CD2}$. In some embodiments, a variation of the second ratio may be greater than a variation of the first ratio.

Figure 16A:
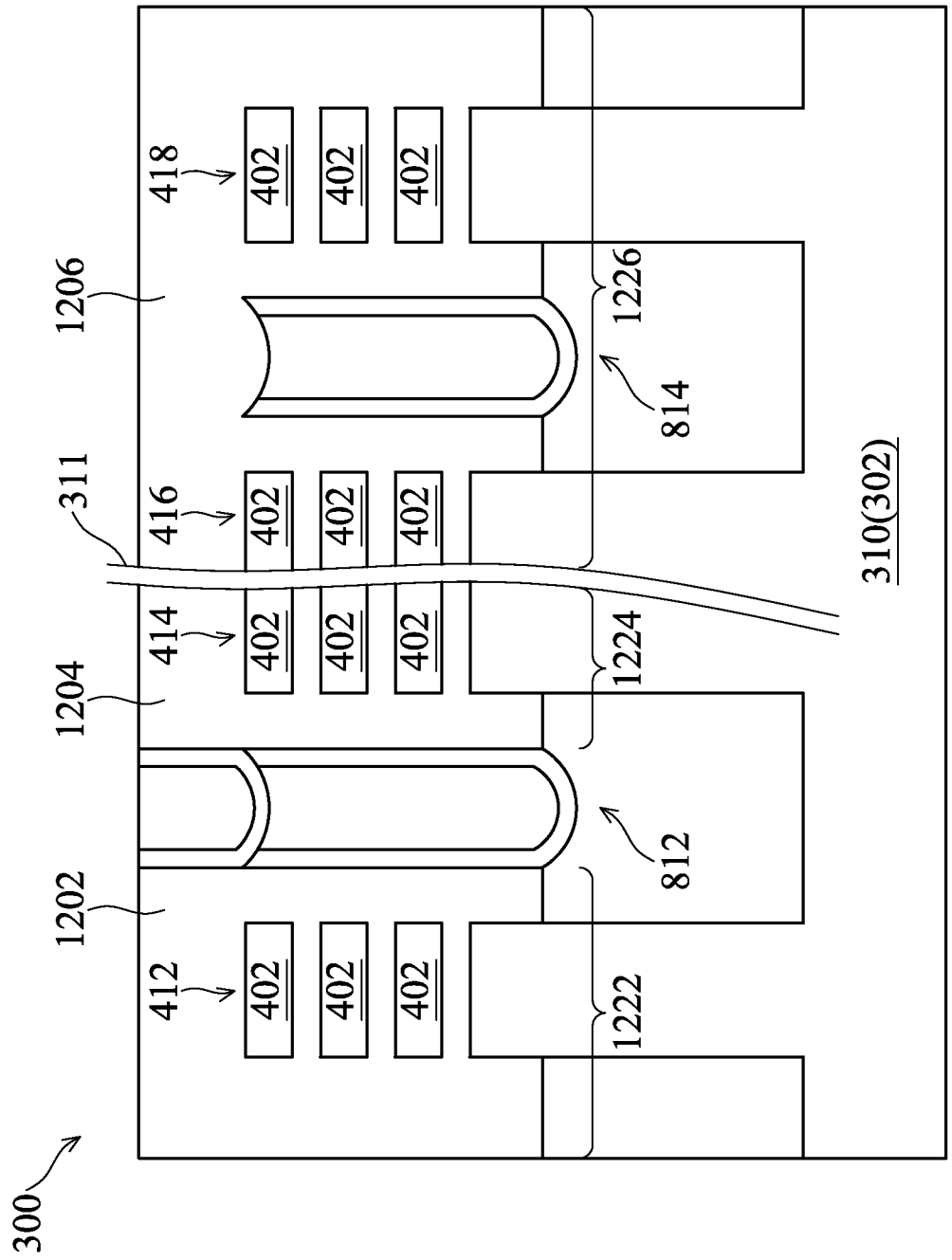
Figure 16B:
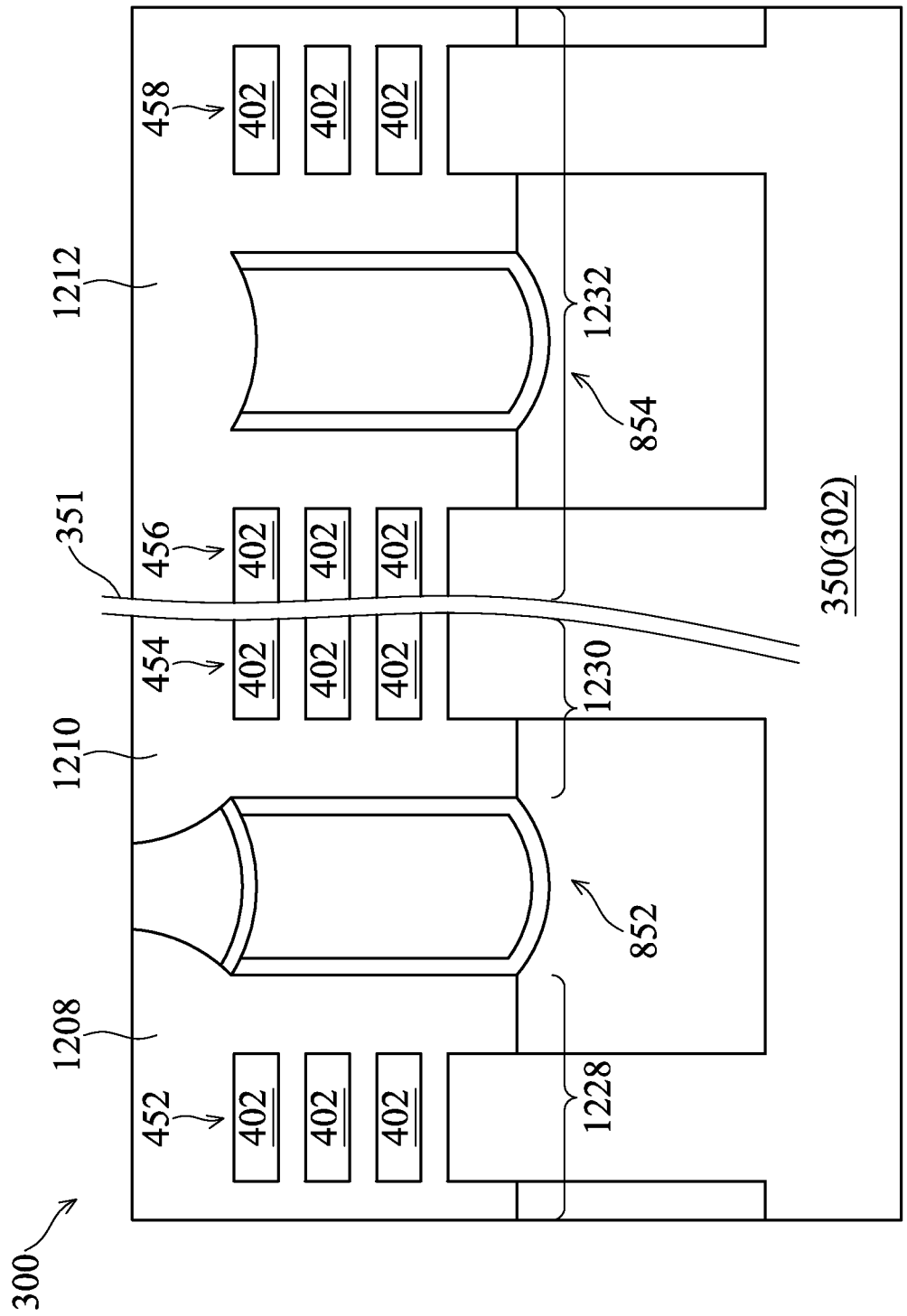

Corresponding to operation 214 of FIG. 2, FIG. 16A is a cross-sectional view of the nanosheet FET device 300 including active (e.g., metal) gate structures 1202, 1204, and 1206 in the area 310, and FIG. 16B is a cross-sectional view of the nanosheet FET device 300 including active (e.g., metal) gate structures 1208, 1210, and 1212 in the area 350, at one of the various stages of fabrication. The cross-sectional views of FIGS. 16A-B are each cut in a direction along the lengthwise direction of an active/dummy gate structure of the nanosheet FET device 300 (e.g., cross-section A-A indicated in FIG. 1).

Subsequently to forming the ILD over the source/drain structures, the (remaining) dummy gate structures 712, 714, 752, and 754, and the (remaining) sacrificial layers 401 of each semiconductor fin may be removed. In various embodiments, the dummy gate structures and the sacrificial layers can be removed by applying a selective etch (e.g., a hydrochloric acid (HCl)), while leaving the channel layers 402 of each semiconductor fin substantially intact. After the removal of the dummy gate structures, a gate trench, exposing respective sidewalls of each of the channel layers 402 may be formed. After the removal of the sacrificial layers 401 to further extend the gate trench, respective bottom surface and/or top surface of each of the channel layers 402 may be exposed. Consequently, a full circumference of each of the channel layers 402 can be exposed. Next, the gate trench can be filled with an active gate structure, and such an active gate structure can wrap around each of the channel layers 402 of one or more semiconductor fins.

For example in FIG. 16A illustrating the area 310, the active gate structure 1202 is formed to wrap around each of the channel layers 402 of the fin structure 412; the active gate structure 1204 is formed to wrap around each of the channel layers 402 of the fin structure 414; and the active gate structure 1206 is formed to wrap around each of the channel layers 402 of the fin structures 416 and 418. In FIG. 16B illustrating the area 350, the active gate structure 1208 is formed to wrap around each of the channel layers 402 of the fin structure 452; the active gate structure 1210 is formed to wrap around each of the channel layers 402 of the fin structure 454; and the active gate structure 1212 is formed to wrap around each of the channel layers 402 of the fin structures 456 and 458.

The active gate structures 1202 to 1212 can each include a gate dielectric and a gate metal, in some embodiments. The gate dielectric can wrap around each of the channel layers 402 (e.g., the top and bottom surfaces and sidewalls). The gate dielectric may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. In some embodiments, the gate dielectric may optionally include a substantially thin oxide (e.g., $SiO_x$) layer, which may be a native oxide layer formed on the surface of each of the channel layers 402.

The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

Upon forming the active gate structures 1202 to 1212, a number of transistors can be defined (or otherwise formed) in the area 310 and area 350, respectively. For example, in the area 310, a transistor 1222 that adopts the active gate structure 1202 and the channel layers 402 of the semiconductor fin 412 as its gate and channel, respectively, can be formed; a transistor 1224 that adopts the active gate structure 1204 and the channel layers 402 of the semiconductor fin 414 as its gate and channel, respectively, can be formed; and a transistor 1226 that adopts the active gate structure 1206 and the channel layers 402 of both the semiconductor fins 416 and 418 as its gate and channel, respectively, can be formed. In the area 350, a transistor 1228 that adopts the active gate structure 1208 and the channel layers 402 of the semiconductor fin 452 as its gate and channel, respectively, can be formed; a transistor 1230 that adopts the active gate structure 1210 and the channel layers 402 of the semiconductor fin 454 as its gate and channel, respectively, can be formed; and a transistor 1232 that adopts the active gate structure 1212 and the channel layers 402 of both the semiconductor fins 456 and 458 as its gate and channel, respectively, can be formed.

In some embodiments, each of the transistors 1222-1226 formed in the high density area 310 may sometimes be referred to as a core transistor, and each of the transistors 1228-1232 formed in the low density area 350 may sometimes be referred to as an I/O transistor. The I/O transistor can operate under a relatively high gate voltage, and the core transistor can operate under a relatively low gate voltage.

In one aspect of the present disclosure, a semiconductor device is disclosed. The semiconductor device includes a substrate including a first area and a second area. The semiconductor device in the first area includes a first dielectric fin that that extends along a first lateral direction and is disposed between a first semiconductor channel and a second semiconductor channel, wherein the first dielectric fin electrically isolates a first gate structure and a second gate structure, the first and second gate structures extending along a second lateral direction. The semiconductor device in the second area includes a second dielectric fin that that extends along the first lateral direction and is disposed between a third semiconductor channel and a fourth semiconductor channel, wherein the second dielectric fin electrically isolates a third gate structure and a fourth gate structure, the third and fourth gate structures extending along the second lateral direction. A first width of the first dielectric fin along the second lateral direction remains substantially constant, and a second width of at least an upper portion of the second dielectric fin along the second lateral direction decreases with an increasing height of the second dielectric fin.

In another aspect of the present disclosure, a method for making a semiconductor device is disclosed. The method includes forming a first semiconductor channel and a second semiconductor channel in a first area of a substrate. The method includes forming a third semiconductor channel and a fourth semiconductor channel in a second area of the substrate. The first through fourth semiconductor channels all extend along a first lateral direction. The method includes forming a first dielectric fin in the first area between the first and second semiconductor channels, wherein the first dielectric fin extends along the first lateral direction. The method includes forming a second dielectric fin in the second area between the third and fourth semiconductor channels, wherein the second dielectric fin extends along the first lateral direction. The method includes forming a first dummy gate structure including a first portion and a second portion disposed over the first and second semiconductor channels, respectively. The method includes forming a second dummy gate structure including a first portion and a second portion disposed over the third and fourth semiconductor channels, respectively. The first and second dummy gate structures both extend along a second lateral direction perpendicular to the first lateral direction. The method includes changing a profile of the second dielectric fin thereby forming a second distance between sidewalls of at least an upper portion of the second dielectric fin along the second lateral direction that decreases with an increasing height of the second dielectric fin, while remaining a first distance between sidewalls of the first dielectric fin along the second lateral direction substantially unchanged.

In yet another aspect of the present disclosure, a method for making a semiconductor device is disclosed. The method includes forming a dielectric fin over a substrate between a first semiconductor fin and a second semiconductor fin. The first and second semiconductor fins, and the dielectric fin all extend along a first lateral direction. The method includes forming a dummy gate structure that extends along a second lateral direction and includes a first portion and a second portion. The first and second portions overlay the first and second semiconductor fins, respectively, and separate from each other with the dielectric fin. The method includes removing upper sidewall portions of the dielectric fin. The method includes replacing the first and second portions of the dummy gate structure with a first and second active gate structures, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate including a first area and a second area;
wherein the semiconductor device in the first area comprises:
a first dielectric fin that that extends along a first lateral direction and is disposed between a first semiconductor channel and a second semiconductor channel, wherein the first dielectric fin electrically isolates a first gate structure and a second gate structure, the first and second gate structures extending along a second lateral direction; and
a second dielectric fin extending along the first lateral direction, the second dielectric fin having a lower portion and an upper portion, the first dielectric fin having a lower portion having a same first height as the lower portion of the second dielectric fin, but no upper portion;
wherein the semiconductor device in the second area comprises:
a third dielectric fin that that extends along the first lateral direction and is disposed between a third semiconductor channel and a fourth semiconductor channel, wherein the third dielectric fin electrically isolates a third gate structure and a fourth gate structure, the third and fourth gate structures extending along the second lateral direction; and
a fourth dielectric fin extending along the first lateral direction, the fourth dielectric fin having a lower portion having a same second height as a lower portion of the third dielectric fin, but no upper portion, the third dielectric fin having an upper portion;
wherein a first width of the first dielectric fin along the second lateral direction remains substantially constant over the lower portion of the first dielectric fin, a second width of at least the upper portion of the second dielectric fin along the second lateral direction decreases with an increasing height of the second dielectric fin;
wherein a fourth width of the fourth dielectric fin along the second lateral direction remains substantially constant over the lower portion of the fourth dielectric fin, at least the upper portion of the third dielectric fin having a third width;
wherein a width of the lower portions of the first and second dielectric fins are the same; and
wherein a width of the lower portions of the third and fourth dielectric fins are the same, and the first width is greater than the third width, the second width is greater than the fourth width.

2. The semiconductor device of claim 1, wherein a first density of transistors formed in the second area is greater than a second density of transistors formed in the first area.

3. The semiconductor device of claim 1, wherein transistors formed in the first area are configured for operation under a first gate voltage, and transistors formed in the second area are configured for operation under a second gate voltage, and wherein the first gate voltage is greater than the second gate voltage.

4. The semiconductor device of claim 1, wherein each of the first, and second semiconductor channels includes a plurality of semiconductor layers vertically separated from one another.

5. The semiconductor device of claim 1, wherein at least an upper portion of the third gate structure and at least an upper portion of the fourth gate structure each extend toward the third dielectric fin along the second lateral direction.

6. The semiconductor device of claim 1, wherein the third width of the lower portion of the third dielectric fin along the second lateral direction is greater than the second width.

7. The semiconductor device of claim 6, wherein the second width decreases with the increasing height of the second dielectric fin.

8. The semiconductor device of claim 1, wherein the at least the upper portion of the third dielectric fin comprises a plurality of films.

9. The semiconductor device of claim 8, wherein at least one of the plurality of films forms the sidewalls separated by the decreasing third width.

10. A semiconductor device, comprising:
a substrate including a first area and a second area;
wherein the semiconductor device in the first area comprises:
a first dielectric fin that that extends along a first lateral direction and is disposed between a first semiconductor channel and a second semiconductor channel, wherein the first dielectric fin electrically isolates a first gate structure and a second gate structure, the first and second gate structures extending along a second lateral direction;
and
a second dielectric fin extending along the first lateral direction, the second dielectric fin having a lower portion and an upper portion, the first dielectric fin having a lower portion having a same first height as the lower portion of the second dielectric fin, but no upper portion;
wherein the semiconductor device in the second area comprises:
a third dielectric fin that extends along the first lateral direction and is disposed between a third semiconductor channel and a fourth semiconductor channel, wherein the third dielectric fin electrically isolates a third gate structure and a fourth gate structure, the third and fourth gate structures extending along the second lateral direction, and
a fourth dielectric fin extending along the first lateral direction, the fourth dielectric fin having a lower portion having a same height as a lower portion of the third dielectric fin, but no upper portion, the third dielectric fin having an upper portion;
wherein a first width of the first dielectric fin along the second lateral direction remains substantially constant over the lower portion of the first dielectric fin, a second width of at least the upper portion of the second dielectric fin along the second lateral direction decreases with an increasing height of the second dielectric fin;
wherein a fourth width of the fourth dielectric fin along the second lateral direction remains substantially constant over the lower portion of the fourth dielectric fin, at least the upper portion of the third dielectric fin having a third width;
wherein a width of the lower portions of the first and second dielectric fins are the same;
wherein a width of the lower portions of the third and fourth dielectric fins are the same, and the first width is greater than the third width, the second width is greater than the fourth width; and
wherein at least the upper portion of the second dielectric fin comprises a plurality of films.

11. The semiconductor device of claim 10, wherein at least one of the plurality of films forms the sidewalls separated by the decreasing of the first dielectric fin along the second lateral direction.

12. The semiconductor device of claim 10, wherein a first density of transistors formed in the second area is greater than a second density of transistors formed in the first area.

13. The semiconductor device of claim 10, wherein transistors formed in the first area are configured for operation under a first gate voltage, and transistors formed in the second area are configured for operation under a second gate voltage, and wherein the first gate voltage is greater than the second gate voltage.

14. The semiconductor device of claim 10, wherein each of the first and second semiconductor channels includes a plurality of semiconductor layers vertically separated from one another.

15. A semiconductor device, comprising:
a substrate including a first area and a second area;
wherein the semiconductor device in the first area comprises:
a first dielectric fin that extends along a first lateral direction and is disposed between a first semiconductor channel and a second semiconductor channel, wherein the first dielectric fin electrically isolates a first gate structure and a second gate structure, the first and second gate structures extending along a second lateral direction; and
a second dielectric fin extending along the first lateral direction, the second dielectric fin having a lower portion and an upper portion, the first dielectric fin having a lower portion having a same first height as the lower portion of the second dielectric fin, but no upper portion;
wherein the semiconductor device in the second area comprises:
a third dielectric fin that that extends along the first lateral direction and is disposed between a third semiconductor channel and a fourth semiconductor channel, wherein the third dielectric fin electrically isolates a third gate structure and a fourth gate structure, the third and fourth gate structures extending along the second lateral direction, and
a fourth dielectric fin extending along the first lateral direction, the fourth dielectric fin having a lower portion having a same second height as a lower portion of the third dielectric fin, but no upper portion, the third dielectric fin having an upper portion;
wherein a first width of the first dielectric fin along the second lateral direction remains substantially constant over the lower portion of the first dielectric fin, a second width of at least the upper portion of the second dielectric fin along the second lateral direction decreases with an increasing height of the second dielectric fin;

wherein a fourth width of the fourth dielectric fin along the second lateral direction remains substantially constant over the lower portion of the fourth dielectric fin at least the upper portion of the third dielectric fin having a third width;

wherein a width of the lower portions of the first and second dielectric fins are the same;

wherein a width of the lower portions of the third and fourth dielectric fins are the same, and the first width is greater than the third width; and wherein the upper portion of the third dielectric fin has a greater width than a width of the lower portion of the third dielectric fin.

16. The semiconductor device of claim 15, further comprising at least one of a plurality of films forms the sidewalls separated by the decreasing of the first dielectric fin along the second lateral direction.

17. The semiconductor device of claim 15, wherein a first density of transistors formed in the second area is greater than a second density of transistors formed in the first area.

18. The semiconductor device of claim 15, wherein transistors formed in the first area are configured for operation under a first gate voltage, and transistors formed in the second area are configured for operation under a second gate voltage, and wherein the first gate voltage is greater than the second gate voltage.

19. The semiconductor device of claim 15, wherein each of the first and second semiconductor channels includes a plurality of semiconductor layers vertically separated from one another.

* * * * *